(12) United States Patent
Amarnath et al.

(10) Patent No.: US 11,568,945 B2
(45) Date of Patent: Jan. 31, 2023

(54) FAST SENSING SCHEME WITH AMPLIFIED SENSING AND CLOCK MODULATION

(71) Applicant: SANDISK TECHNOLOGIES LLC, Addison, TX (US)

(72) Inventors: Anirudh Amarnath, San Jose, CA (US); Jongyeon Kim, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 52 days.

(21) Appl. No.: 17/343,075

(22) Filed: Jun. 9, 2021

(65) Prior Publication Data

US 2022/0399062 A1 Dec. 15, 2022

(51) Int. Cl.
| | |
|---|---|
| G11C 11/34 | (2006.01) |
| G11C 16/34 | (2006.01) |
| G11C 16/10 | (2006.01) |
| G11C 16/26 | (2006.01) |
| G11C 16/32 | (2006.01) |
| G11C 16/04 | (2006.01) |
| G11C 11/56 | (2006.01) |
| H01L 27/11582 | (2017.01) |
| H01L 27/11519 | (2017.01) |
| H01L 27/11565 | (2017.01) |
| H01L 27/11556 | (2017.01) |

(52) U.S. Cl.
CPC ...... *G11C 16/3459* (2013.01); *G11C 16/0483* (2013.01); *G11C 16/10* (2013.01); *G11C 16/26* (2013.01); *G11C 16/32* (2013.01); *G11C 11/5628* (2013.01); *G11C 11/5671* (2013.01); *H01L 27/11519* (2013.01); *H01L 27/11556* (2013.01); *H01L 27/11565* (2013.01); *H01L 27/11582* (2013.01)

(58) Field of Classification Search
CPC ............ G11C 16/3454; G11C 16/3459; G11C 11/5628; G11C 16/0483; G11C 2211/5621
USPC .......................... 365/185.22, 189.05, 185.19
See application file for complete search history.

(56) References Cited

U.S. PATENT DOCUMENTS

| | | | |
|---|---|---|---|
| 2021/0005265 A1* | 1/2021 | Lee .................. | G11C 16/08 |
| 2021/0118513 A1* | 4/2021 | Kim .................. | G11C 16/3459 |

* cited by examiner

*Primary Examiner* — Son T Dinh
(74) *Attorney, Agent, or Firm* — Morgan, Lewis & Bockius LLP

(57) ABSTRACT

A method of verifying the programming of a plurality of memory cells in a data storage system includes performing a setup operation including settling of bit lines associated with the subset of memory cells; performing a sensing operation including subjecting the settled bit lines to a verify voltage signal; and performing first and second latching operations identifying memory cells of the subset of memory cells having threshold voltages that meet first and second verify reference voltages, where the first and second latching operations are part of the same program verify operation with no setup time between them.

20 Claims, 20 Drawing Sheets

FAST SENSING SCHEME WITH AMPLIFIED SENSING AND CLOCK MODULATION

TECHNICAL FIELD

The present description relates in general to data storage systems and methods, and more particularly to, program verification operations.

BACKGROUND

The growing demand for high capacity storage devices has catalyzed the use of multi-level not and (NAND) flash memory cells, which include multi-level cells (MLC, 2 bits per cell), triple level cells (TLC, 3 bits per cell), quad level cells (QLC, 4 bits per cell), and higher capacities. As the number of bits stored in a memory cell increases, the level of precision required for reliable data programming and verification operations also becomes stricter in tandem. In addition, as flash memory arrays continue to decrease in size, challenges arise in scaling performance improvements along with the size improvements.

Existing approaches for programming and verification operations for multi-level cells involve redundant sensing operations which create performance bottlenecks as memory arrays continue to become more complex and decrease in size. Thus, there is a need for a more efficient method of programming and verifying multi-level cells.

SUMMARY

The implementations included herein describe an improved sensing scheme for verifying program operations in an array of multi-level cells. The improved sensing uses a modulating clock signal and successive latching operations to eliminating overhead-inducing setup time between successive sensing, thereby improving programming performance.

In one aspect, a data storage system comprises a storage medium including a plurality of memory cells; control circuitry coupled to the storage medium; program circuitry configured to receive a program instruction from the control circuitry and program a subset of the plurality of memory cells in accordance with the program instruction by subjecting the subset of memory cells to at least one program pulse; and sensing circuitry configured to verify a programming state of the subset of memory cells subsequent to a first program pulse of the at least one program pulse, wherein the sensing circuitry is configured to verify the programming state by performing a first program verify operation.

In some implementations, the first program verify operation includes a setup operation including settling of bit lines associated with the subset of memory cells; a sensing operation including subjecting the settled bit lines to a verify voltage signal; a first latching operation identifying which memory cells of the subset of memory cells have a Vt that meets a first verify reference voltage, wherein the first verify reference voltage represents a lower limit of a voltage distribution curve of the programming state; and a second latching operation identifying which memory cells of the subset of memory cells have a Vt that meets a second verify reference voltage, wherein the second verify reference voltage is lower than the first verify reference voltage.

In some implementations, the second latching operation follows the first latching operation and precedes setup operations associated with any program verify operation subsequent to the first program verify operation.

In some implementations, the program circuitry is further configured to: apply a second program pulse following the first program pulse to memory cells of the subset of memory cells identified as having a Vt that does not meet the second verify reference voltage; apply a third program pulse, the third program pulse having a lower magnitude than the second program pulse, following the first program pulse to memory cells of the subset of memory cells identified as having a Vt that meets the second verify reference voltage; and inhibit subsequent programming of memory cells of the subset of memory cells identified as having a Vt that meets the first verify reference voltage.

In some implementations, the sensing operation includes: ramping up a clock level of the sensing circuitry from an initial level to a first modulation level; and pre-charging a sensing node of the sensing circuitry to pre-charge to a first level while the clock level is at or ramping up to the first modulation level.

In some implementations, the sensing operation further includes, subsequent to the pre-charging of the sensing node: ramping up the clock level of the sensing circuitry to a second modulation level higher than the first modulation level; and charging the sensing node to a second level higher than the first level based on a coupling ratio of a capacitor charged in accordance with the clock level.

In some implementations, the sensing operation further includes, subsequent to the charging of the sensing node: discharging the sensing node through a bit line of a memory cell of the subset of memory cells for a first time period, wherein the first time period is based on a target cell current; ramping down the clock level to the first modulation level; and the first latching operation includes latching a voltage in accordance with the discharged sensing node being higher than a voltage threshold.

In some implementations, the sensing operation further includes, subsequent to the first strobing operation, ramping down the clock level to the initial level causing the sensing node to further discharge; and the second latching operation includes latching a voltage in accordance with the further discharged sensing node being higher than the voltage threshold.

In some implementations, the sensing circuitry is configured to perform the first and second latching operations without settling any bit lines between the first and second latching operations.

Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
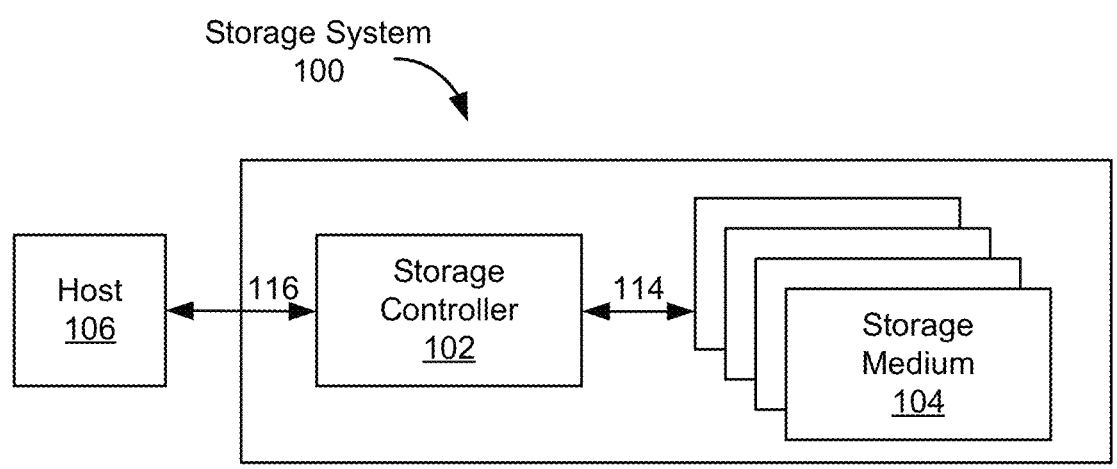
FIG. 1 is a functional block diagram of a non-volatile storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a functional block diagram of a non-volatile storage system in accordance with some implementations. Storage system 100 includes a storage controller 102 (sometimes referred to as a flash memory controller) and non-volatile memory that may be made up of one or more storage mediums 104 (sometimes referred to as memory dies). As used herein, the term storage medium (or memory die) refers to a plurality of non-volatile memory cells (e.g., one or more memory arrays), and associated circuitry (e.g., peripheral circuitry) for managing the physical operation of the non-volatile memory cells. In some implementations, the memory cells and associated circuitry are formed on a single semiconductor substrate. Storage controller 102 interfaces with a host system 106 (also referred to as a host) and transmits command sequences for read, program, and erase operations to storage medium(s) 104. Throughout this disclosure, reference may be made to a single storage medium 104. However, it should be understood that such features may additionally or alternatively be implemented across a plurality of storage mediums 104.

The storage controller 102 manages data stored on one or more storage mediums 104 (e.g., flash memory) and communicates with a host 106, such as a computer or electronic device. The storage controller 102 can have various functionality in addition to the specific functionality described herein. For example, the storage controller 102 can format the storage medium 104 to ensure the memory is operating properly, map out bad memory cells, and allocate spare memory cells to be substituted for future failed memory cells. Some part of the spare memory cells can be used to hold firmware to operate the storage controller 102 and implement other features.

In operation, when the host 106 needs to read data from or write data to a storage medium 104, the host 106 communicates with the storage controller 102. If the host 106 provides a logical address to which data is to be read/written, the storage controller 102 may convert the logical address received from the host 106 to a physical address in the storage medium 104. Alternatively, the host 106 may provide the physical address. The storage controller 102 may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The storage medium(s) 104 may include any suitable non-volatile storage medium, including NAND flash memory cells and/or NOR flash memory cells. The memory cells can take the form of solid-state (e.g., flash) memory cells and can be one-time programmable, few-time programmable, or multi-time programmable. The memory cells can also be single-level cells (SLC), multiple-level cells (MLC), triple-level cells (TLC), quad-level cells (QLC), or use other memory cell level technologies. Also, the memory cells can be fabricated in a two-dimensional or three-dimensional fashion.

The interface between the storage controller 102 and the storage medium(s) 104 may be any suitable flash interface, such as Toggle Mode or Open NAND Flash Interface (ONFI).

In some implementations, storage system 100 may be a card-based system, such as a secure digital (SD) or a micro secure digital (micro-SD) card. In some implementations, storage system 100 may be part of an embedded storage system. For example, the storage controller 102 and storage medium(s) 104 may be embedded within the host 106, such as in the form of a solid-state disk (SSD) drive installed in a computer. Such an SSD may emulate, replace, or be used instead of a hard disk drive inside the host 106, or be used as a NAS device, and so forth. In any case, such an SSD need not be made to work as a hard drive.

Although in the example illustrated in FIG. 1, storage system 100 includes a single channel between storage controller 102 and storage medium 104, the subject matter described herein is not limited to having a single memory channel. For example, in some storage system architectures, two, four, eight, or more channels may exist between the storage controller 102 and the storage medium(s) 104, depending on controller capabilities. In any of the implementations described herein, a plurality of channels may exist between the storage controller 102 and the storage medium(s) 104, even if a single channel is depicted in the drawings.

In some implementations, an intermediate storage controller (not shown) may interface the host 106 with the storage controllers 102 of a plurality of storage systems 100. The interface between the intermediate storage controller and the plurality of storage systems 100 may be a bus interface, such as a serial advanced technology attachment (SATA) or peripheral component interface express (PCIe) interface. The plurality of storage systems 100 may be implemented in a solid state drive (SSD), such as found in portable computing devices, such as laptop computers, tablet computers, or mobile devices.

In some implementations, a plurality of intermediate storage controllers (not shown) may respectively interface the host 106 with the storage controllers 102 of a plurality of storage systems 100. Such a system may be referred to as a hierarchical storage system. The host 106 may access memories within the storage systems 100 via a bus interface. In some implementations, the bus interface may be an NVMe or fiber channel over Ethernet (FCoE) interface. In some implementations, a hierarchical storage system may be a rack mountable mass storage system that is accessible by multiple host 106 computers, such as would be found in a data center or other location where mass storage is needed.

Figure 2:
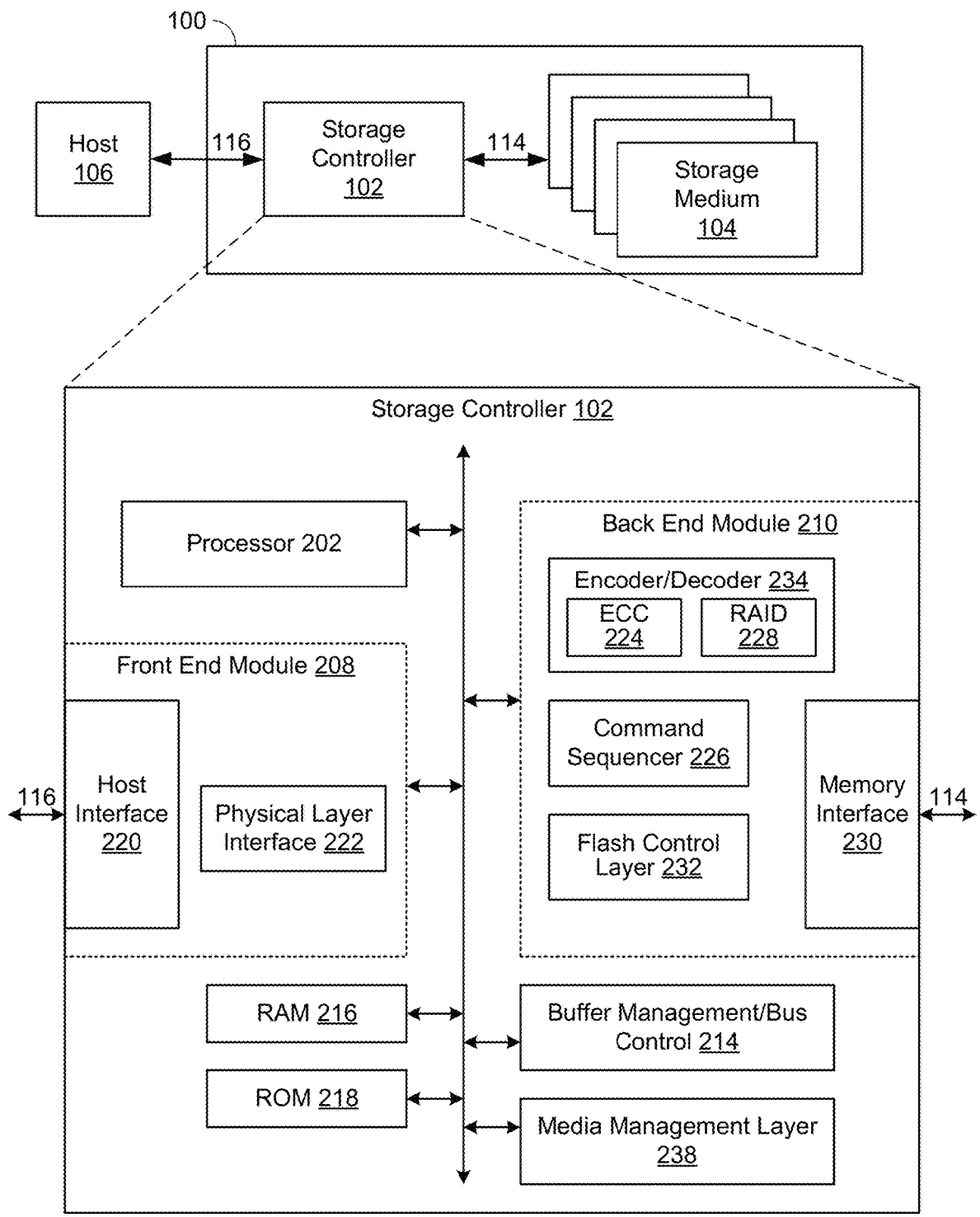
FIG. 2 is a functional block diagram of an example storage controller of the storage system depicted in FIG. 1 in accordance with some implementations.

FIG. 2 is a functional block diagram of an example storage controller 102 of the storage system 100 in accordance with some implementations. Storage controller 102 includes a front-end module 208 that interfaces with a host 106, a back-end module 210 that interfaces with one or more non-volatile storage mediums 104, and various other modules that perform functions described herein.

The storage controller 102 can take the form of processing circuitry, a microprocessor or processor, and a non-transitory computer-readable medium that stores computer-readable program code (e.g., firmware) executable by the (micro)processor, logic gates, switches, an application specific integrated circuit (ASIC), a programmable logic controller, and/or an embedded microcontroller, for example. Storage controller 102 can be configured with hardware and/or firmware to perform the various functions described herein. Also, some of the components shown as being internal to the storage controller 102 (e.g., RAM 216 and ROM 218) can also be stored external to the storage controller 102, and other components can be used. Additionally, the phrase "operatively in communication with" could mean directly in communication with or indirectly (wired or wireless) in communication with through one or more components, which may or may not be shown or described herein.

The components of storage controller 102 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for storage controller 102 to perform the functions described herein.

The storage controller 102 may include a buffer manager/bus controller 214, configured to manage buffers in random access memory (RAM) 216 and control the internal bus arbitration of the storage controller 102. A read only memory (ROM) 218 may store system boot code. Although illustrated in FIG. 2 as located within the storage controller 102, in some implementations one or both of the RAM 216 and ROM 218 may be located separately from the storage controller 102. In yet other implementations, portions of RAM 216 and ROM 218 may be located both within the storage controller 102 and outside the storage controller 102. Further, in some implementations, the storage controller 102, RAM 216, and ROM 218 may be located on separate semiconductor dies.

The storage controller 102 may include one or more processors 202 configured to control the overall operation of the storage controller 102. The processor 202 may issue commands to control circuitry 310 (FIG. 3) of storage medium 104, or to any other component of storage medium 104, via memory interface 230. In some implementations, the ROM 218 and/or RAM 216 may comprise code such as a set of instructions, and the processor 202 may be operable to execute the set of instructions to provide the functionality described herein. Additionally or alternatively, the processor 202 may access code from a portion of the memory array 350 (FIG. 3) in the storage medium 104, such as a reserved area of memory cells connected to one or more word lines.

The front-end module 208 includes a host interface 220 that provides a communication interface with the host 106.

The choice of the type of host interface 220 can depend on the type of memory being used. Examples of host interfaces include, but are not limited to, SATA, SATA Express, SAS, Fibre Channel, USB, PCIe, and NVMe. The host interface 220 is a communication interface that facilitates transfer for data, control signals, and timing signals. The host interface 220 may include electrical interface circuitry that provides a physical connection to the channel(s) 116 connecting the storage controller 102 to the host. This electrical interface circuitry may be part of the host interface 220, or may be separately described as a physical layer interface 222.

In some implementations, the host interface 220, in communication with ROM 218, RAM 216, and/or processor 202, may be an electrical circuit that provides an electrical interface between the storage controller 102 and the host 106. For example, the host interface 220 may change the format or timing of signals, provide a buffer, isolate from surges, latch I/O, and so forth. Commands and data from the host 106 are received by the storage controller 102 via the host interface 220. Data sent to the host 106 is transmitted via the host interface 220.

The back-end module 210 includes a memory interface 230 that provides command sequences and data (to be written) to storage medium(s) 104 and receives status information and data (that was read) from storage medium(s) 104. In some implementations, the memory interface 230 may be a double data rate (DDR) interface such as Toggle Mode or ONFI.

In some implementations, the memory interface 230, in communication with ROM 218, RAM 216, and/or processor 202, may be an electrical circuit that provides an electrical interface between the storage controller 102 and the storage medium 104. For example, the memory interface 230 may change the format or timing of signals, provide a buffer, isolate from surges, latch I/O, and so forth.

The back-end module 210 may include an error correction controller (ECC) engine 224 and/or a Redundant Array of Independent Dies (RAID) module 228. The ECC engine 224 may be configured to encode data received from the host 106, and decode and error correct data read from the storage medium 104. The RAID module 228 may be configured to manage generation of RAID parity and recovery of failed data. The RAID parity may be used as an additional level of integrity protection for the data being written into the storage medium 104. In some implementations, the RAID module 228 may be a part of the ECC engine 224. The RAID parity may be added as an extra die or dies as implied by the common name, but it may also be added within the existing die, e.g., as an extra plane, or extra block, or extra WLs within a block. ECC engine 224 and RAID module 228 may both calculate redundant data that can be used to recover when errors occur and may be considered examples of redundancy encoders. Together, ECC engine 224 and RAID module 228 may be considered to form a combined redundancy encoder/decoder 234.

The back-end module 210 may include a command sequencer 226, and/or a flash control layer 232. The command sequencer 226 may generate command sequences, such as program and erase command sequences, for transmission to storage medium 104. The flash control layer 232 may control the overall operation of the back-end module 210.

The storage controller 102 may include a media management layer 238, which performs wear leveling of memory cells of storage medium 104. The storage controller 102 may also include other discrete components (not shown), such as external electrical interfaces, external RAM, resistors, capacitors, or other components that may interface with storage controller 102. In some implementations, one or more of the physical layer interface 222, RAID module 228, media management layer 238 and buffer management/bus controller 214 are optional components that are not necessary in the storage controller 102.

The Flash Translation Layer (FTL) or Media Management Layer (MML) 238 may be integrated as part of the flash management that may handle flash errors and interfacing with the host 106. In particular, the MML 238 may be a module in flash management and may be responsible for the internals of NAND management. In particular, the MML 238 may include an algorithm in the storage device firmware which translates writes from the host 106 into writes to the storage medium 104. The MML 238 may be needed because: 1) storage medium 104 may have limited endurance; 2) storage medium 104 may only be written in multiples of pages; and/or 3) a selected portion of memory cells of the storage medium 104 may not be written unless it is erased as a block (i.e. a block may be considered to be a minimum unit of erase and such a non-volatile memory may be considered a block-erasable non-volatile memory). The MML 238 may address these potential limitations of the storage medium 104 which may not be visible to the host 106. Accordingly, the MML 238 may translate write operations received from the host 106 into write operations for transmission to the storage medium 104.

Figure 3:
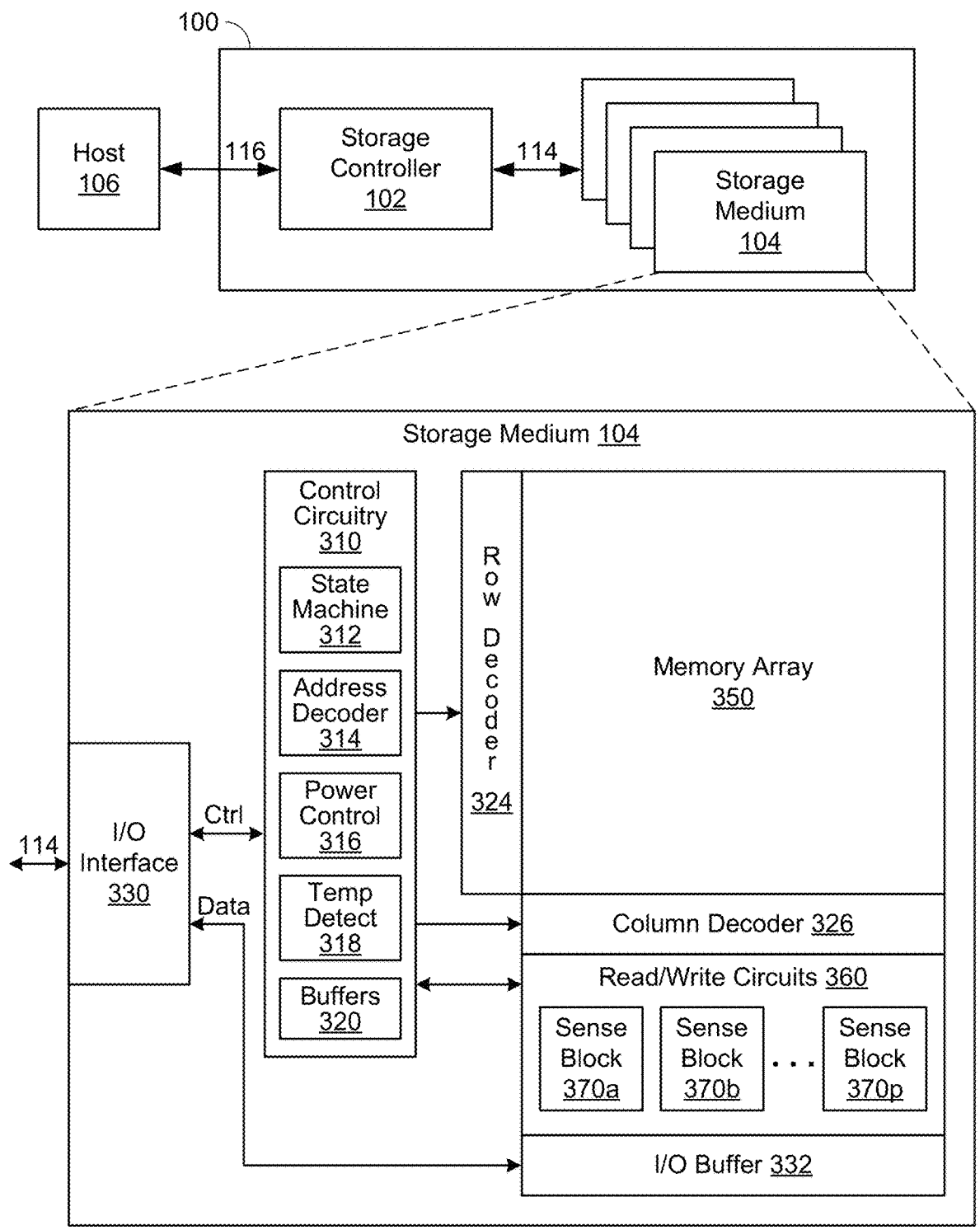
FIG. 3 is a functional block diagram of an example storage medium of the storage system depicted in FIG. 1 in accordance with some implementations.

FIG. 3 is a functional block diagram of an example storage medium 104 of the storage system 100 in accordance with some implementations. Storage medium 104 includes a memory array 350 including a plurality of memory cells, control circuitry 310, read/write circuits 360, and an input/output (I/O) interface 330.

In some implementations, a storage controller 102 (as described above with reference to FIG. 2) may included in the same storage device (e.g., a removable storage card) as the storage medium(s) 104. However, in other implementations, the storage controller 102 may be separated from the storage medium(s) 104. In some implementations, the storage controller 102 may be disposed on a different die than the storage medium 104. In some implementations, one storage controller 102 may communicate with a plurality of storage mediums 104. In some implementations, each storage medium 104 may have its own storage controller 102.

Commands and data may be transferred between the host 106 and the storage controller 102 via a data bus 116, and between the storage controller 102 and storage medium(s) 104 via an interface channel 114. In some implementations, the I/O interface 330 includes a set of I/O pins (also referred to as pads) that connect to respective communication lines of the interface channel 114. The I/O interface 330 may be connected to the control circuitry 310, row decoder 324, column decoder 326, read/write circuits 360, and/or memory array 350.

The I/O interface 330 may be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 900) is an asynchronous memory interface that supports SDR and DDR with a DQS signal acting as a data strobe signal.

Data received at the I/O interface 330 for writing to the memory array 350 (in accordance with a write command) is latched in an I/O buffer 332 before being written to the memory array 350. Similarly, data that is read from the memory array 350 (in accordance with a read command) is latched in the I/O buffer 332 before being transmitted to the storage controller 102 via the I/O interface 330. The I/O buffer 332 may be included in the I/O interface 330 or otherwise communicatively coupled to the I/O interface 330. The I/O buffer 332 includes a plurality of data latches. In some implementations, the data latches are arranged in groups of 8 (XDL0 through XDL7) or 16 (XDL0 through XDL15), depending on how many bits the I/O interface 330 is configured to receive or transmit at a time.

The read/write circuits 360 include multiple sense blocks 370 including 370a through 370p (sensing circuitry) and allow a page (or multiple pages) of data in multiple memory cells of the memory array 350 to be read or programmed (written) in parallel. In some implementations, each sense block 370 includes one or more sense amplifiers connected to respective bit lines of the memory array 350. The sense amplifiers sense voltage signals associated with selected memory cells (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Each bit line of the memory array 350 is coupled to a sense block 370, each of which includes one or more sense amplifiers. The sense amplifiers sense voltages on each bit line in accordance with read operations. The sense amplifiers sense the low power signals from respective bit lines that represents data bits (1 or 0) stored in respective memory cells. The sense amplifiers amplify small voltage swings to recognizable logic levels so the data can be interpreted properly by logic outside the memory array (e.g., storage controller 102). After a sense amplifier for a particular bit line amplifies the sensed voltage to a normal logic level, the bit from the desired cell is then latched from the cell's sense amplifier into a data latch in the I/O buffer 332, and transferred to the storage controller 102 on data lines DQ of the output bus 114.

The sense amplifiers sense data read onto corresponding bit lines from a plurality of memory cells associated with the corresponding bit lines. The sense amplifiers may include bit line drivers for applying a voltage to corresponding bit lines in accordance with write data. The sense amplifier for a given bit line or group of bit lines may directly control the bit line(s). In data reading, the read/write circuits 360 may apply a strobe signal to a given sense amplifier. The sense amplifier determines data at the assertion timing of the strobe signal (e.g., an ON state of a memory cell may be defined as data "0", and an off state may be defined as data "1"). This data may be held in an internal latch SADL of the sense amplifier before being transferred to one of the data latches of the I/O buffer 332.

Input and output of data to and from the sense amplifiers are performed via the data latches of the I/O buffer 332. That is, data received from the storage controller 102 is transferred to sense amplifiers via the data latches. In addition, data in the sense amplifiers (in internal latches of the sense amplifiers) is transmitted to the storage controller 102 via the data latches. The data latches of the I/O buffer 332 may function as the cache memory of the storage medium 104.

The control circuitry 310 cooperates with the read/write circuits 360 to perform memory operations (e.g., write, read, erase, and others) on the memory array 350. In some implementations, control circuitry 310 includes a state machine 312, an on-chip address decoder 314, a power control circuit 316, a temperature detection circuit 318, and/or buffers 320.

The state machine 312 provides die-level control of memory operations. In some implementations, the state machine 312 is programmable by software. In other implementations, the state machine 312 does not use software and is completely implemented in hardware (e.g., electrical circuits). In some implementations, the state machine 312 can be replaced by a microcontroller or microprocessor.

The address decoder 314 provides an address interface between addresses used by the host 106 or storage controller 102 to the hardware address used by the decoders 324 and 326.

The power control module 316 controls the power and voltages supplied to the word lines and bit lines during memory operations. It can include drivers for word line layers (discussed below) in a 3D configuration, select transistors (e.g., SGS and SGD transistors, described below) and source lines. Power control module 316 may include charge pumps for creating voltages.

The temperature detection circuit 318 may be configured to detect temperature in or around the storage medium 104. The temperature detection circuit 318 may include an on-chip temperature sensor.

The buffers 320 may be registers, ROM fuses, and/or other storage devices for storing default values such as base voltages and other parameters.

Any one or any combination of control circuitry 310, state machine 312, decoders 314/324/326, temperature detection circuit 318, power control module 316, sense blocks 370, read/write circuits 360, and storage controller 102 can be considered one or more control circuits (or managing circuitry, or peripheral circuitry) that performs the functions described herein.

The memory array 350 may be addressable by word lines via a row decoder 324 and by bit lines via a column decoder 326. The memory array 350 may comprise one or more 2D or 3D arrays of memory cells. The memory array 350 may comprise a monolithic 3D memory array in which multiple memory levels are formed above (and not in) a single substrate, such as a wafer, with no intervening substrates. The memory array 350 may comprise any type of non-volatile memory that is monolithically formed in one or more physical levels of arrays of memory cells having an active area disposed above a silicon substrate. The memory array 350 may be in a non-volatile memory device having circuitry associated with the operation of the memory cells, whether the associated circuitry is above or within the substrate.

Multiple memory elements in memory array 350 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. In some implementations, the non-volatile memory cells of memory array 350 comprise vertical NAND strings with charge-trapping material. In such a configuration, a NAND string includes memory cells connected by a channel.

A NAND flash memory array 350 may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array 350 may be arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory array 350 may be vertically arranged as a stack of multiple two-dimensional memory device levels. As another non-limiting example, a three-dimensional memory array 350 may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of a non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

In some implementations, the memory array 350 comprises a two dimensional memory array of non-volatile memory cells. In one example, the non-volatile memory cells are NAND flash memory cells utilize floating gates. Other types of memory cells (e.g., NOR-type flash memory) can also be used.

The exact type of memory array architecture or memory cells included in the memory array 350 is not limited to the examples above. Many different types of memory array architectures or memory cell technologies can be used to form the memory array 350. No particular non-volatile memory technology is required for purposes of the implementations described herein. Other examples of suitable technologies for memory cells of the memory array 350 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of the memory array 350 include two dimensional arrays, three dimensional arrays, cross-point arrays, stacked two dimensional arrays, vertical bit line arrays, and the like.

A person of ordinary skill in the art will recognize that the technology described herein is not limited to a single specific memory array, but covers many relevant memory arrays within the spirit and scope of the technology as described herein and as understood by one of ordinary skill in the art.

Figure 4A:
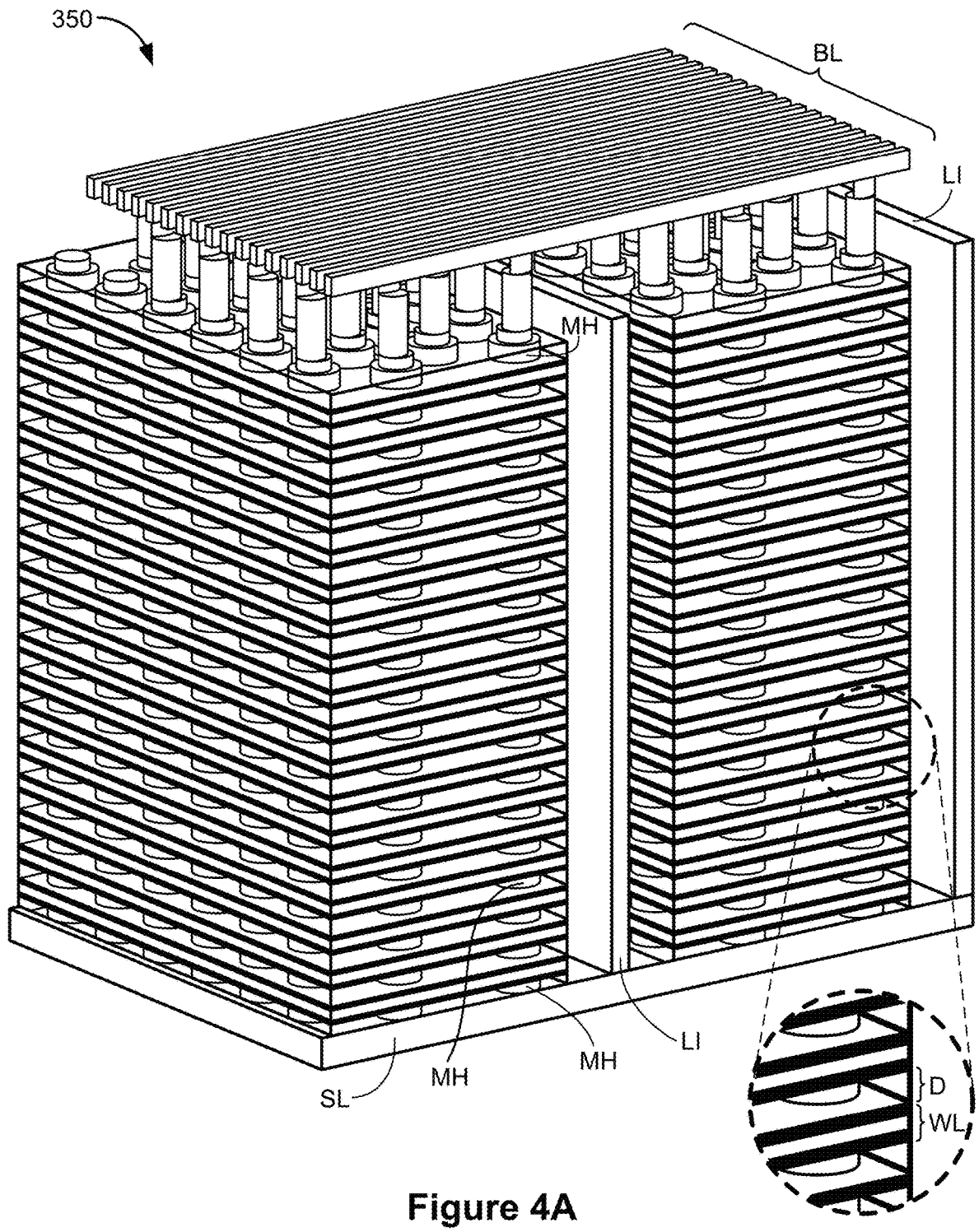
FIG. 4A is a perspective view of a portion of one implementation of a three-dimensional monolithic memory array in accordance with some implementations.

FIG. 4A is a perspective view of a portion of an example implementation of a monolithic three dimensional memory array that may comprise memory array 350, which includes a plurality of non-volatile memory cells. For example, FIG. 4A shows a portion of one block of memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as WL.

The number of alternating dielectric layers and conductive layers can vary based on specific implementation requirements. One set of implementations includes between 104-216 alternating dielectric layers and conductive layers. One example implementations includes 96 data word line layers, 8 select layers, 6 dummy word line layers and 110 dielectric layers. More or less than 104-216 layers can also be used. As will be explained below, the alternating dielectric layers and conductive layers may be divided into four "fingers" or sub-blocks by local interconnects L1. FIG. 4A shows two fingers and two local interconnects L1. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 4A, the dielectric layers are depicted as see-through so that the reader can see the memory holes positioned in the stack of alternating dielectric layers and conductive layers. In some implementations, NAND strings are formed by filling the vertical column/memory hole with materials including a charge-trapping material to create a vertical column of memory cells. Each memory cell can store one or more bits of data. More details of the three dimensional monolithic memory array that comprises memory array 350 are provided below with reference to FIG. 4B-4F.

Figure 4B:
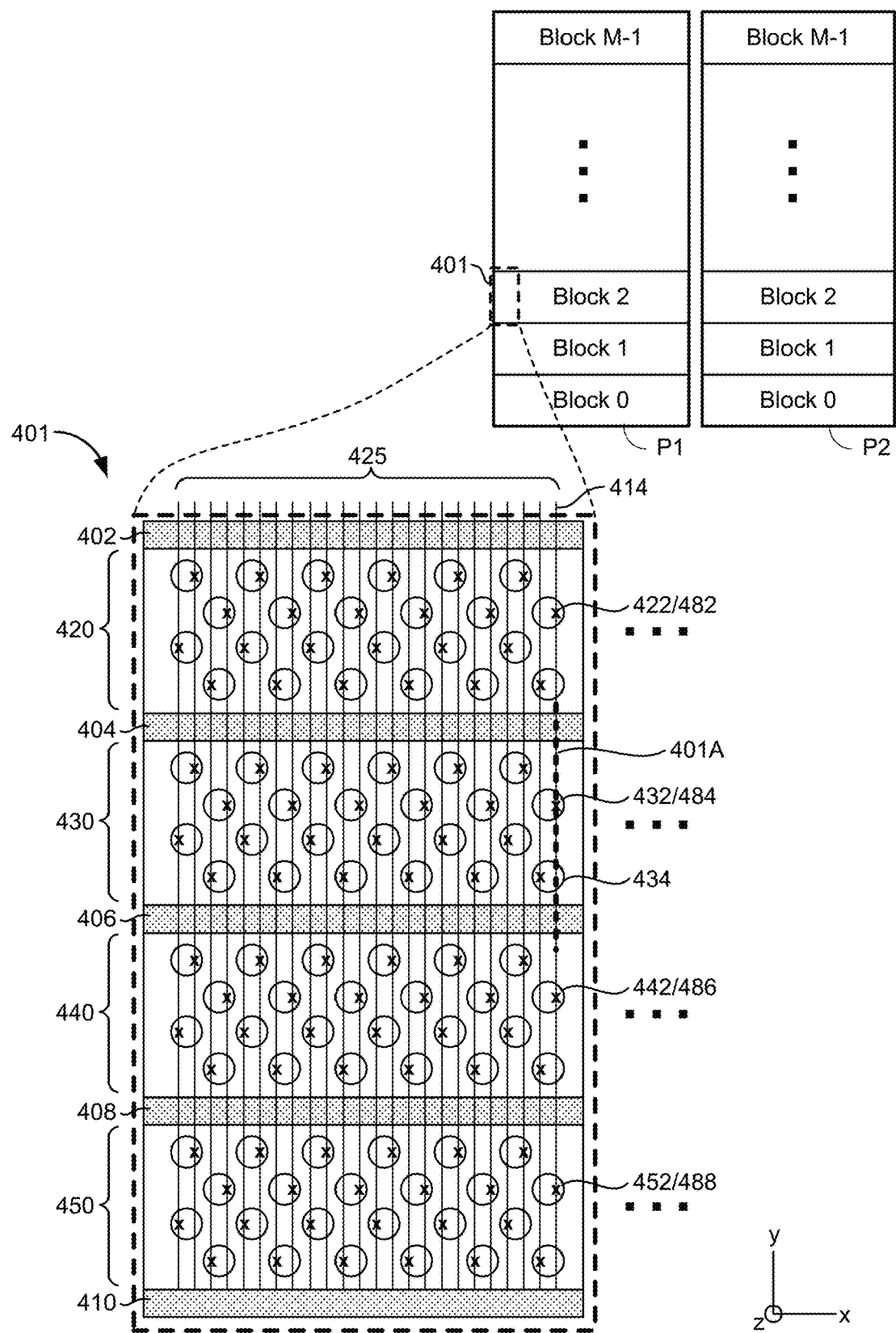
FIG. 4B is a block diagram of a memory array having two planes, and a top view of a portion of a block of memory cells in accordance with some implementations.

FIG. 4B depicts an example three dimensional (3D) NAND structure that corresponds to the structure of FIG. 4A and can be used to implement memory array 350 of FIG. 3. The memory array 350 may be divided into two planes P1 and P2. Each plane may be divided into M blocks. In one example, each plane has about 2000 blocks. However, different numbers of blocks and planes can also be used. In some implementations, a block of memory cells is a unit of erase. That is, all memory cells of a block are erased together.

In some implementations, memory cells can be grouped into blocks for other reasons, such as to organize the memory array 350 to enable the signaling and selection circuits. In some implementations, a block represents a groups of connected memory cells as the memory cells of a block share a common set of unbroken word lines and unbroken bit lines. Block 0 and block M−1 of both planes P1 and P2 may be referred to as being located in an edge region/section of the memory array 350.

FIG. 4B further includes a detailed top view of a portion 401 of one block from the memory array 350. The block depicted in portion 401 extends in the x direction. In some implementations, the memory array 350 has many layers; however, FIG. 4B only shows the top layer.

FIG. 4B depicts a plurality of circles that represent the vertical columns MH. Each of the vertical columns include multiple select transistors (also referred to as a select gate or selection gate) and multiple memory cells. In some implementations, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the x direction, the block includes more vertical columns than depicted in FIG. 4B.

FIG. 4B also depicts a set of bit lines 425, including bit line 414. FIG. 4B shows twenty four bit lines because only a portion of the block is depicted. More than twenty four bit lines may be connected to vertical columns of the block. Each of the circles representing vertical columns has an "x" to indicate its connection to one bit line. For example, bit line 414 is connected to vertical columns 422, 432, 442 and 452 (but not vertical column 434). In some implementations, bit lines are positioned over the memory array 350 and run along the entire length of the plane (e.g., from the top of plane P1 to the bottom of plane P1).

The block depicted in FIG. 4B includes a set of local interconnects 402, 404, 406, 408, and 410 that connect the various layers to a source line below the vertical columns. Local interconnects 402, 404, 406, 408, and 410 also serve to divide each layer of the block into four regions. For example, the top layer depicted in FIG. 4B is divided into regions 420, 430, 440, and 450, which are referred to as fingers or sub-blocks. In the layers of the block that implement memory cells, the four regions are referred to as word line fingers that are separated by the local interconnects.

In some implementations, the word line fingers on a common level of a block connect together to form a single word line. In some implementations, the word line fingers on the same level are not connected together. In one example implementation, a bit line only connects to one vertical column in each of regions 420, 430, 440 and 450. For such an implementation, each block has sixteen rows of active columns and each bit line connects to four rows in each block. In some implementations, all of four rows connected to a common bit line are connected to the same word line (via different word line fingers on the same level that are connected together). Therefore, the address decoders use the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other implementations may include more or less regions per block, more or less rows of vertical columns per region and more or less rows of vertical columns per block. FIG. 4B also shows the vertical columns being staggered. In other implementations, different patterns of staggering can be used. In some implementations, the vertical columns are not staggered.

Figure 4C:
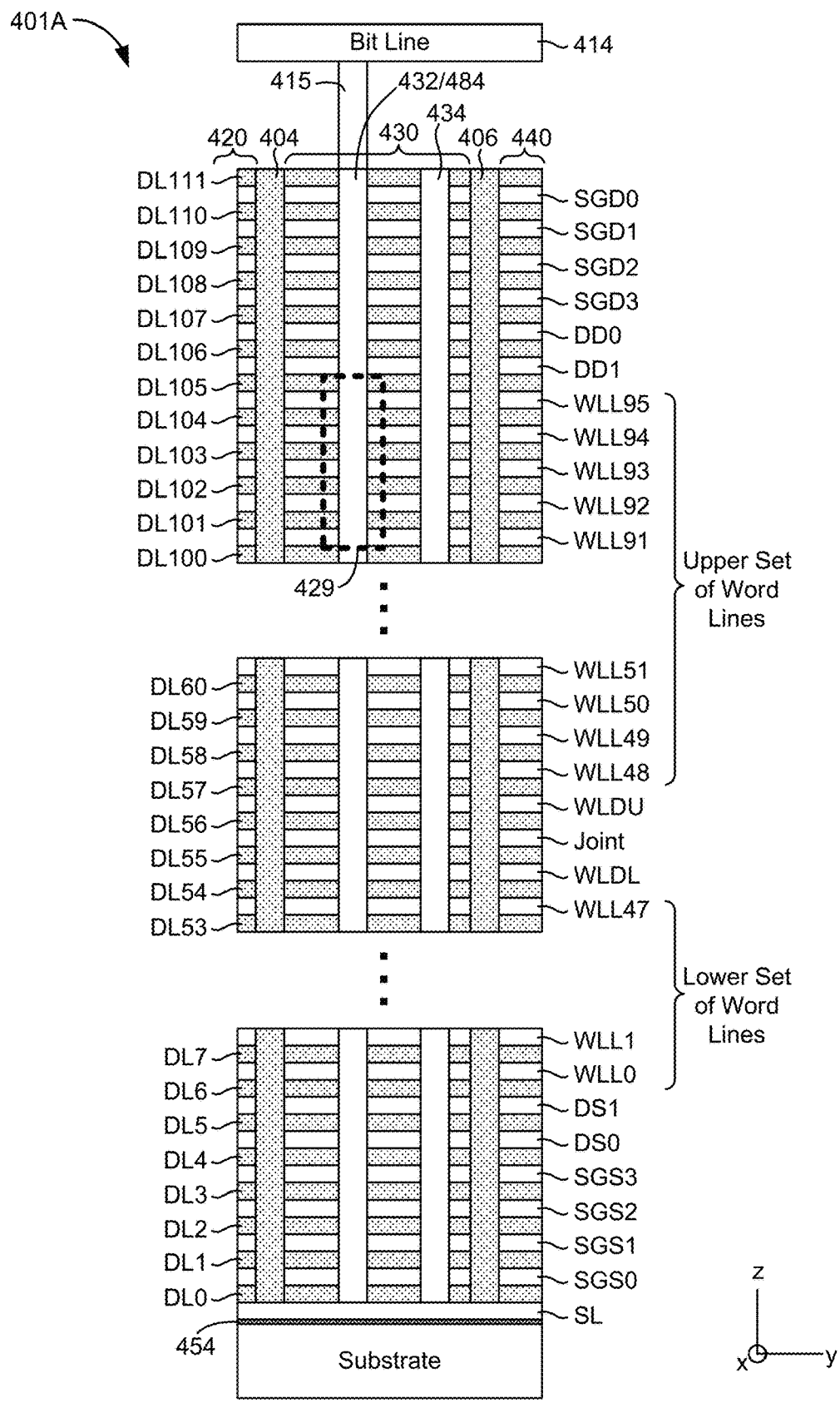
FIG. 4C depicts a cross sectional view of a portion of a block of memory cells in accordance with some implementations.

FIG. 4C depicts a portion of some implementations of the three dimensional memory array 350 showing a cross-sectional view along line 401A of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety-six data word line layers WLL0-WLL95 for connecting to data memory cells. Other implementations can implement more or less than four drain side select layers, more or less than four source side select layers, more or less than six dummy word line layers, and more or less than ninety six word lines.

Vertical columns 432 and 434 are depicted protruding through the drain side select layers, source side select layers, dummy word line layers and word line layers. In some implementations, each vertical column comprises a vertical NAND string. For example, vertical column 432 comprises NAND string 484. Below the vertical columns and the layers listed below is the substrate, an insulating film 454 on the substrate, and the source line SL. The NAND string of vertical column 432 has a source end at a bottom of the stack and a drain end at a top of the stack. As in agreement with FIG. 4B, FIG. 4C shows vertical column 432 connected to bit line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In some implementations, the conductive layers are made from a combination of TiN and Tungsten. In other implementations, other materials can be used to form the conductive layers, such as doped polysilicon, metal such as Tungsten or metal silicide. In some implementations, different conductive layers can be formed from different materials. Between conductive layers are dielectric layers DL0-DL111. For example, dielectric layer DL104 is above word line layer WLL94 and below word line layer WLL95. In some implementations, the dielectric layers are made from SiO2. In other implementations, other dielectric materials can be used to form the dielectric layers.

The non-volatile memory cells are formed along vertical columns which extend through alternating conductive and dielectric layers in the stack. In some implementations, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host 106, such as data from a user of the host 106), while a data memory cell is eligible to store host data. In some implementations, data memory cells and dummy memory cells may have the same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In some implementations it is expensive and/or challenging to etch ninety six word line layers intermixed with dielectric layers. To ease this burden, some implementations include laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect the first stack to the second stack. In FIG. 4C, the first stack is labeled as the "Lower Set of Word Lines" and the second stack is labeled as the "Upper Set of Word Lines." In some implementations, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
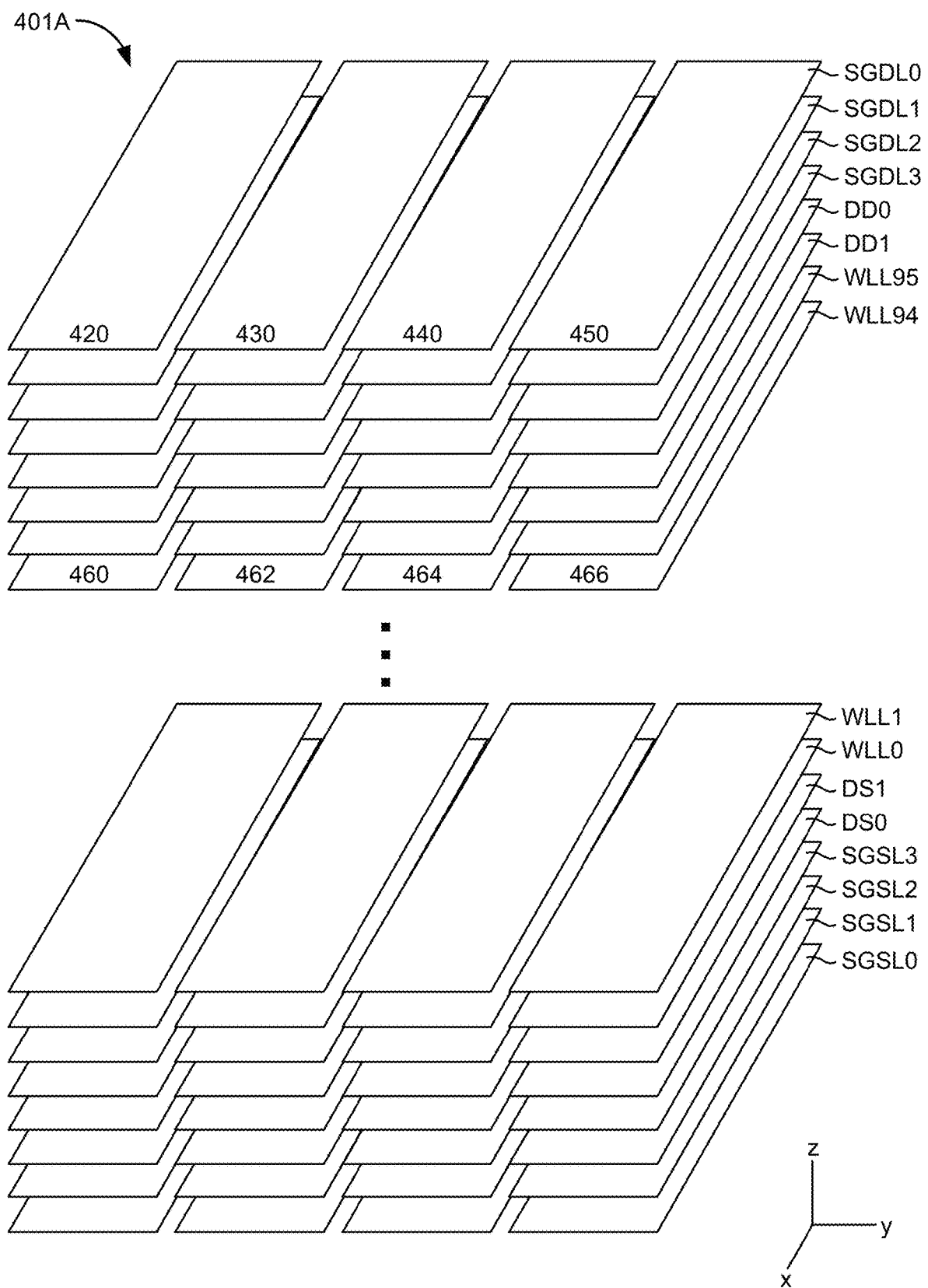
FIG. 4D depicts a view of the select gate layers and word line layers in accordance with some implementations.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with reference to FIG. 4B, in some implementations local interconnects 402, 404, 406, 408, and 410 break up the conductive layers into four regions/fingers (or sub-blocks). For example, word line layer WLL94 is divided into regions 460, 462, 464, and 466. For the word line layers (WLL0-WLL95), the regions are referred to as word line fingers. For example, word line layer WLL94 is divided into word line fingers 460, 462, 464, and 466. For example, region 460 is one word line finger on one word line layer. In some implementations, each word line finger on the same level is connected together. In some implementations, each word line finger operates as a separate word line.

Drain side select gate layer SGD0 (the top layer) is also divided into regions 420, 430, 440, and 450, also known as fingers or select line fingers. In some implementations, each select line finger on the same level is connected together. In some implementations, each select line finger operates as a separate word line.

Figure 4E:
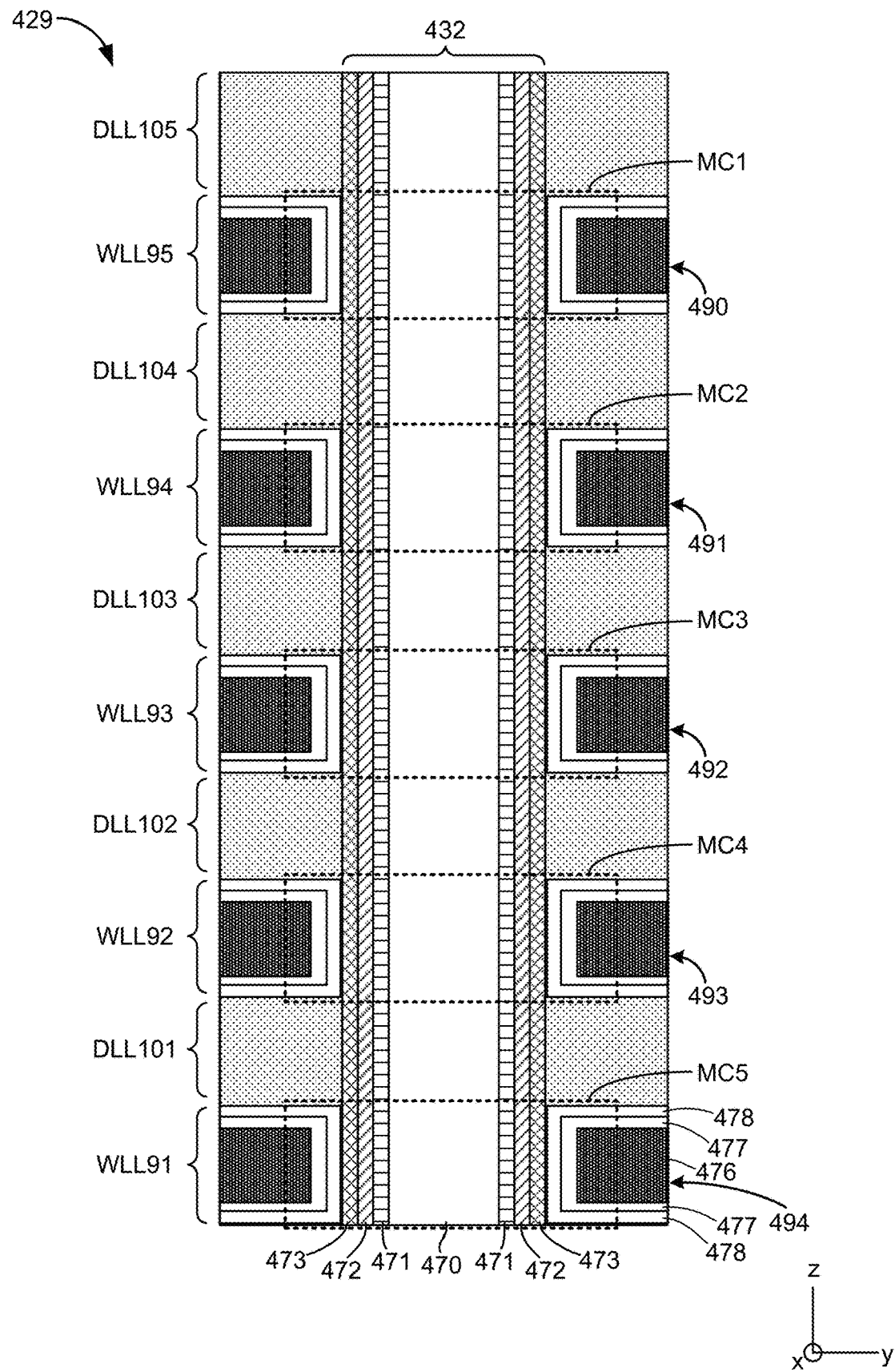
FIG. 4E is a cross sectional view of a vertical column of memory cells in accordance with some implementations.

FIG. 4E depicts a cross sectional view of region 429 of FIG. 4C that includes a portion of vertical column 432 (a memory hole) that extends through the alternating conductive layers and dielectric layers. In some implementations, the vertical columns are round; however, in other implementations other shapes can be used. In some implementations, vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In some implementations, tunneling dielectric 472 has an ONO structure. Surrounding tunneling dielectric 472 is charge trapping layer 473, such as (for example) silicon nitride. Other memory materials and structures can also be used. The technology described herein is not limited to any particular material or structure.

FIG. 4E depicts dielectric layers DLL105, DLL104, DLL103, DLL102, and DLL101, as well as word line layers WLL95, WLL94, WLL93, WLL92, and WLL91. Each of the word line layers includes a word line region 476 surrounded by an aluminum oxide layer 477, which is surrounded by a blocking oxide (e.g., SiO2) layer 478. The physical interaction of the word line layers with the vertical column forms the memory cells. Thus, a memory cell, in some implementations, comprises channel 471, tunneling dielectric 472, charge trapping layer 473, blocking oxide layer 478, aluminum oxide layer 477 and word line region 476.

For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In some implementations, the programming is achieved through Fowler-Nordheim (FN) tunneling of the electrons into the charge trapping layer. During an erase operation, the electrons return to the channel or holes are injected into the charge trapping layer to recombine with electrons. In some implementations, erasing is achieved using hole injection into the charge trapping layer via a physical mechanism such as gate induced drain leakage (GIDL).

Figure 4F:
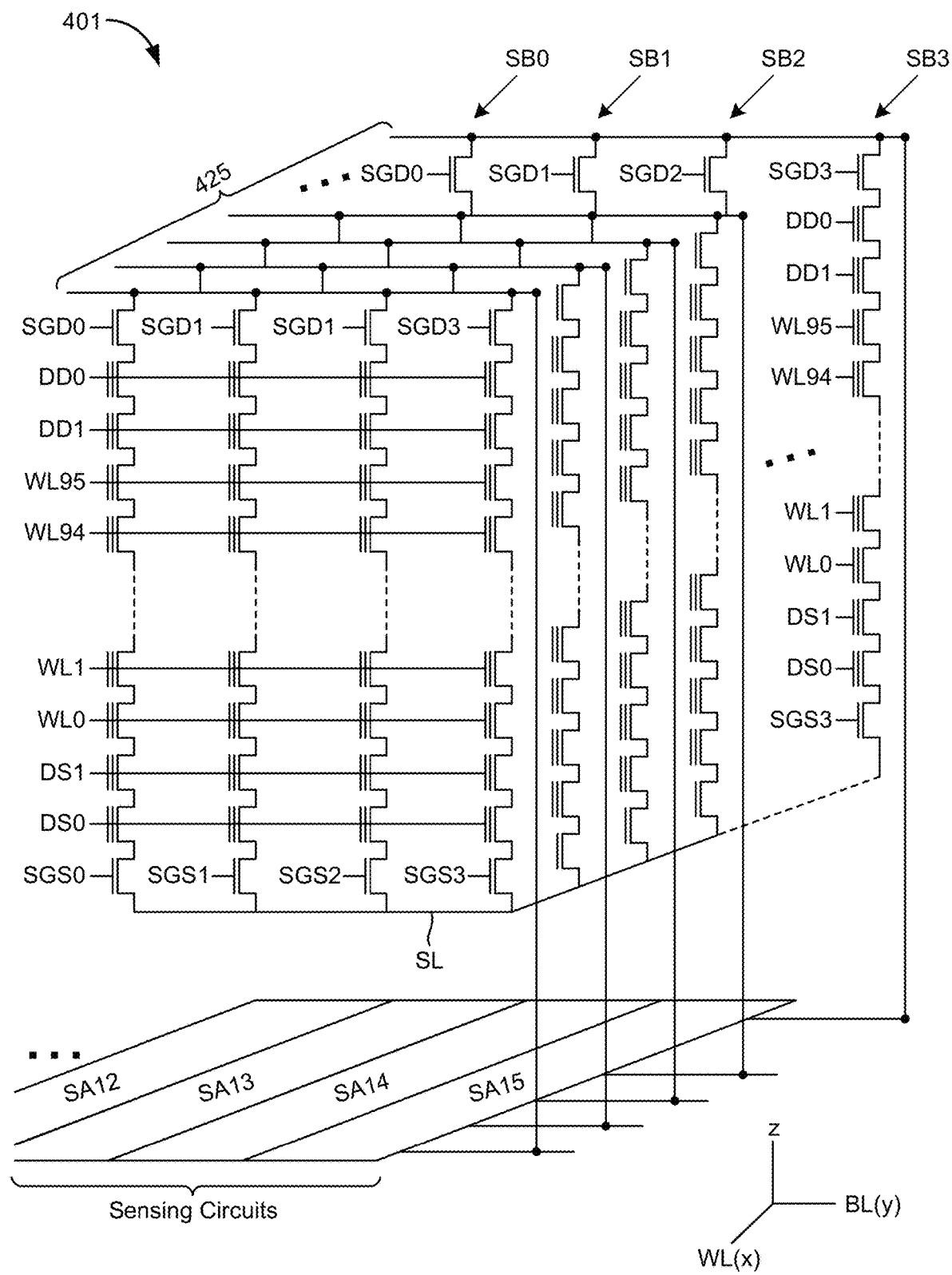
FIG. 4F is a schematic of a plurality of NAND strings in accordance with some implementations.

FIG. 4F is a schematic diagram of a portion of the memory array 350 depicted in FIGS. 4A-4E. FIG. 4A shows physical word lines WLL0-WLL95 running across the entire block. The structure of FIG. 4F corresponds to portion 401 in Block 2 of FIGS. 4B-4E including bit lines 425. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Each bit line 425 is connected to sense amplifiers in the peripheral circuitry of the storage medium 104 (e.g., in sense blocks 370 of the read/write circuits 360). The sense amplifiers sense voltage signals associated with selected memory cells of the respective NAND strings corresponding to each bit line (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Memory cells in the various implementations of the memory array 350 described above can be erased, programmed, and read. At the end of a successful programming process (with verification), the threshold voltages of the memory cells should be within one or more distributions (ranges) of threshold voltages for programmed memory cells or within a distribution (range) of threshold voltages for erased memory cells, as appropriate.

Figure 5A:
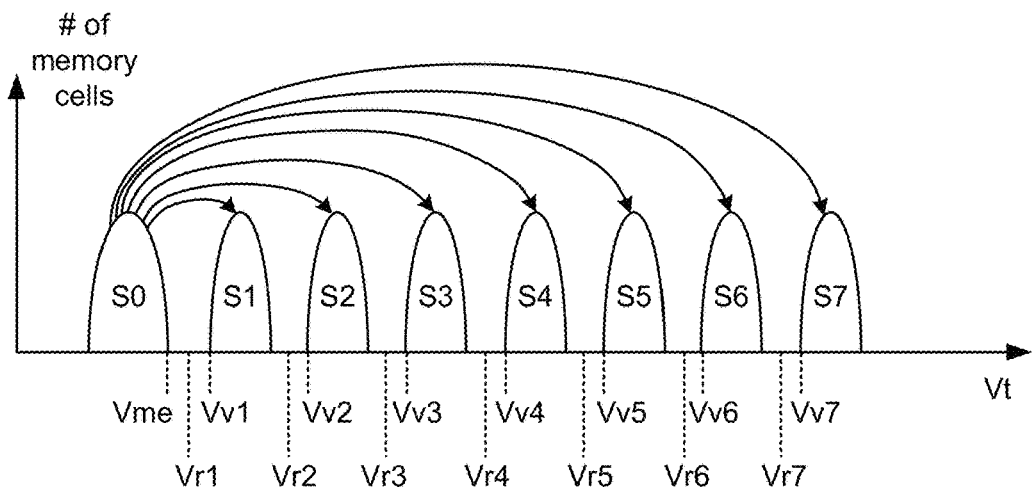
FIG. 5A illustrates example threshold voltage distributions (ranges) for TLC memory cells that store three bits of data in accordance with some implementations.

FIG. 5A illustrates example threshold voltage distributions (ranges) for TLC memory cells that store three bits of data. Other implementations, however, may use other data capacities per memory cell (e.g., such as one, two, four, five, or more bits of data per memory cell). FIG. 5A shows eight threshold voltage distributions, corresponding to eight data states. The first threshold voltage distribution (data state) S0 represents memory cells that are erased. The system uses an erase verify reference voltage Vme to test whether the memory cells are sufficiently erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In some implementations, data values are assigned to the threshold voltage ranges using a Gray code assignment so that if the threshold voltage of a memory erroneously shifts to its neighboring data state, only one bit is affected.

FIG. 5A also shows seven read reference voltages (also referred to as read compare voltages) Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5A also shows seven verify reference voltages (also referred to as program verify targets) Vv1, Vv2, Vv3, Vv4, Vv5, Vv6, and Vv7. When programming memory cells to data state S1, the system tests whether those memory cells have a threshold voltage greater than or equal to Vv1. When programming memory cells to data state S2, the system tests whether the memory cells have threshold voltages greater than or equal to Vv2. When programming memory cells to data state S3, the system determines whether memory cells have their threshold voltage greater than or equal to Vv3. When programming memory cells to data state S4, the system tests whether those memory cells have a threshold voltage greater than or equal to Vv4. When programming memory cells to data state S5, the system tests whether those memory cells have a threshold voltage greater than or equal to Vv5. When programming memory cells to data state S6, the system tests whether those memory cells have a threshold voltage greater than or equal to Vv6. When programming memory cells to data state S7, the system tests whether those memory cells have a threshold voltage greater than or equal to Vv7. Example voltages for FIG. 5A are Vr1=0 v, Vr2=1 v, Vr3=2 v, Vr4=3 v, Vr5=4 v, Vr6=5 v, Vr7=6 v, Vv1=0.4 v, Vv2=1.4 v, Vv3=2.4 v, Vv4=3.4 v, Vv5=4.4 v, and Vv6=5.4 v, Vv7=6.4 v.

In some implementations, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5A represent the full sequence programming. The technology described herein can also be used with other types of programming in addition to full sequence programming (including, but not limited to, multiple stage/phase programming). In some implementations, data states S1-S 7 can overlap, with controller 102 relying on an ECC algorithm to identify the correct data.

Figure 5B:
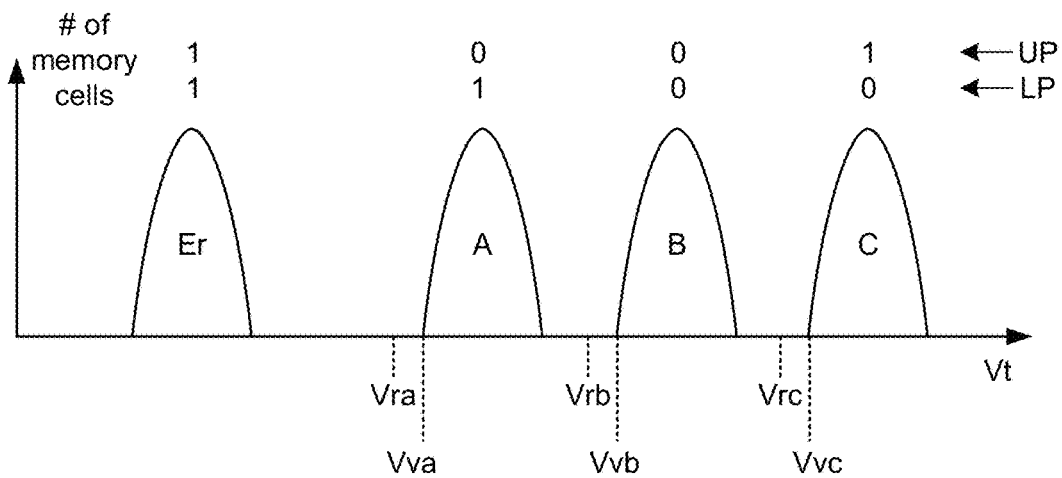
FIG. 5B illustrates example threshold voltage distributions (ranges) for MLC memory cells that store two bits of data in accordance with some implementations.

FIG. 5B illustrates example threshold voltage distributions (ranges) for MLC memory cells that store two bits of data in accordance with some implementations. A first threshold voltage (Vth) distribution corresponding to state Er is provided for erased memory cells. Three Vth distributions corresponding to states A, B, and C represent three programmed states. In some implementations, the threshold voltages in state Er and the threshold voltages in the A, B and C distributions are positive. In some implementations, the threshold voltage distribution for state Er is negative, while the threshold voltage distributions for the A-state, B-state and C-state distributions are positive.

Three read reference voltages, Vra, Vrb and Vrc, are also provided for reading data from memory cells. By testing whether the threshold voltage of a given memory cell is above or below Vra, Vrb and Vrc, the system can determine the state, e.g., programming condition, the memory cell is in.

Further, three verify reference voltages, Vva, Vvb and Vvc, are provided. When programming memory cells to the A-state, B-state or C-state, the system tests whether those memory cells have a threshold voltage greater than or equal to Vva, Vvb or Vvc, respectively.

In the example of FIG. 5B, a multi-state memory cell stores data for two different pages: a lower page (LP) and an upper page (UP). Four states are depicted by the threshold voltage distributions Er, A, B, and C. These states, and the bits they represent, are: Er-state (11), A-state (01), B-state (00) and C-state (10). For Er-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

Figure 5C:
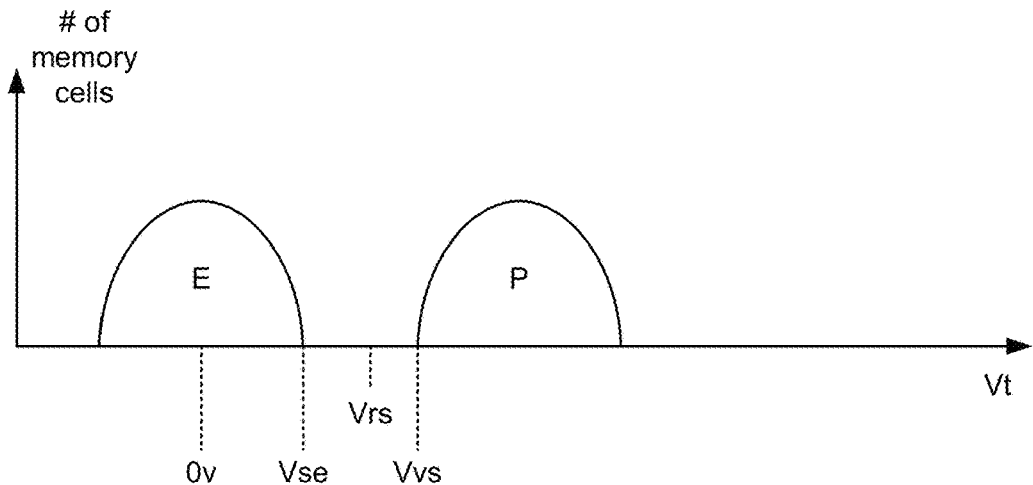
FIG. 5C illustrates example threshold voltage distributions (ranges) for SLC memory cells that store one bit of data in accordance with some implementations.

FIG. 5C illustrates example threshold voltage distributions (ranges) for SLC memory cells. As discussed above, SLC memory cells can be erased or programmed. When erased, the SLC memory cells have threshold voltages in the erased threshold voltage distribution (range) E. When programmed, the SLC memory cells have threshold voltages in the programmed threshold voltage distribution (range) P.

FIG. 5C also shows a read reference voltage (also referred to as read compare voltage) Vrs, a verify reference voltage (also referred to as program verify target) Vvs and an erase verify target Vse. When programming from E to P, the system raises the threshold voltages of the memory cells until they reach at least Vvs. When erasing from P to E, the system lowers the threshold voltages of the memory cells until they reach at least Vse. To read a memory cell storing SLC data, the systems test whether the threshold voltage of the memory cells is less than or greater than Vrs. Example voltages for FIG. 5C are Vse=Vr2=1 v, Vrs=1.2 v and Vvs=2.4 v.

Figure 6:
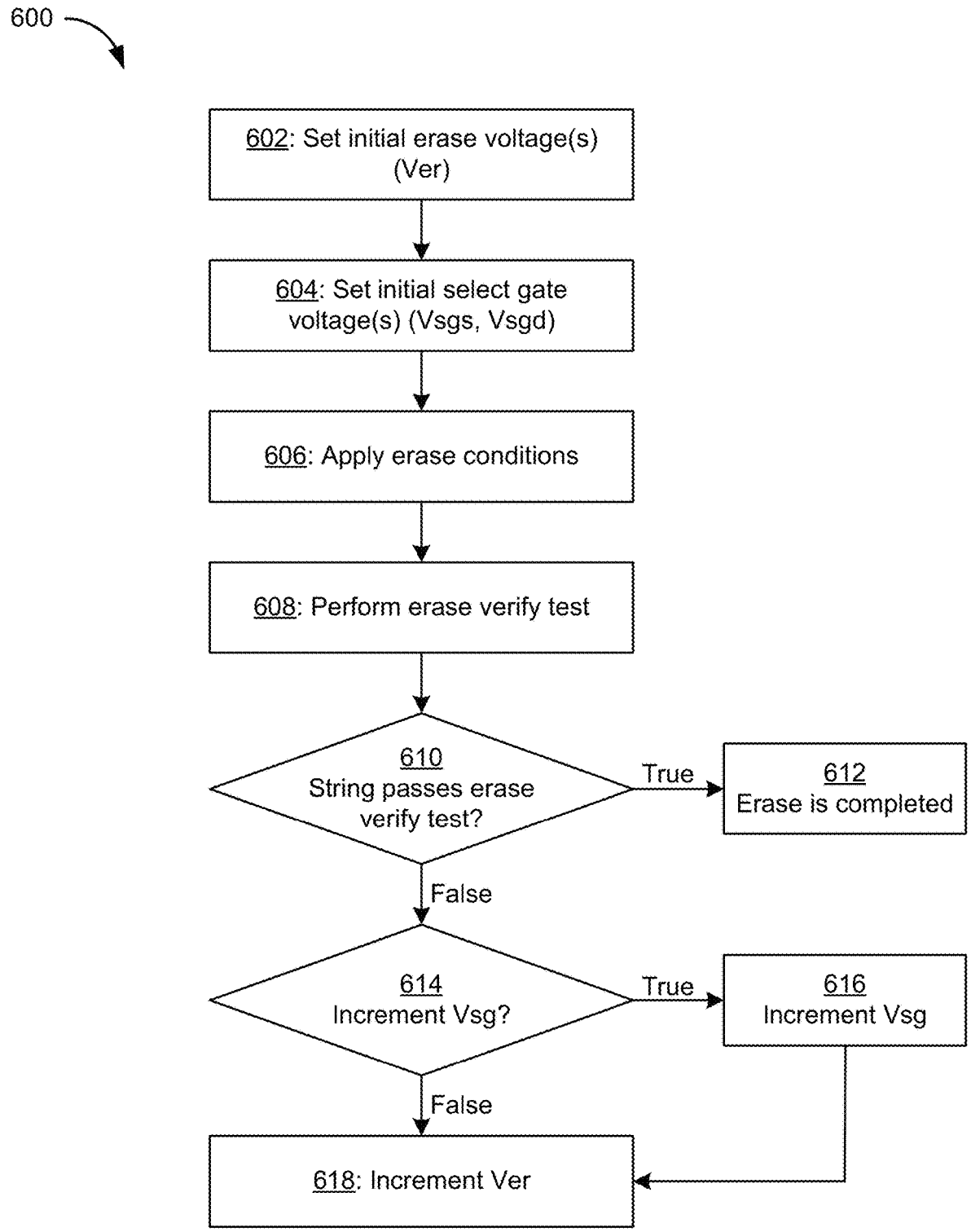
FIG. 6 is a flowchart depicting a process for performing erase operations on a plurality of memory cells in accordance with some implementations.

FIG. 6 is a flowchart depicting a process 600 for performing erase operations on a plurality of memory cells in accordance with some implementations. The process 600 is described with respect to a NAND string of non-volatile memory cells. The NAND string includes a select transistor on each end of the NAND string. For example, a first select transistor may be a drain side select transistor, which has one of its terminals (e.g., drain) coupled to a bit line. A second select transistor may be a source side select transistor, which has one of its terminals coupled to a source line. The process 600 may be performed in parallel on many NAND strings. Therefore, the process 600 may be used to erase a set of word lines. The process 600 may be used to erase a NAND string such as depicted in FIGS. 4A-4F. In some implementations, only the portion of a NAND string that is within a selected tier (e.g., upper tier 510 or lower tier 508) is erased as a unit.

Operation 602 sets a magnitude of an initial steady state erase voltage (Ver). In some implementations, the process 600 performs a two-sided GIDL erase. The erase voltage pulse is to be applied to the bit line and to the source line. In some implementations, the steady state magnitude of the erase voltage pulse is different for the bit line and the source line. In some implementations, the magnitude of the steady state erase voltage is the same for the bit line and the source line. Operation 602 refers to the voltage that is applied to the end of the bit line and the source line that is not adjacent to the select transistors.

Operation 604 sets a magnitude of an initial select gate voltage (Vsg). Herein, Vsg may be referred to as an erase voltage, as it helps to establish a GIDL voltage between two terminals of a select transistor. A select gate voltage (Vsgd) pulse is provided to the drain side select line (e.g., SGD) that is connected to a control gate of a drain side select transistor. A select gate voltage (Vsgs) pulse is provided to the source side select line (e.g., SGS) that is connected to a control gate of a source side select transistor. The magnitudes of Vsgd and Vsgs may be the same as each other or different from each other.

Operation 606 includes applying erase conditions. Operation 606 may include applying voltage pulses to a bit line, a source line, a select line connected to a drain side select transistor, a select line connected to a source side select transistor, and word lines connected to control gates of memory cells. The same magnitude or different magnitude erase voltages may be applied to the bit line and the source line. In some implementations, the drain select line and the source select line are left floating. Erase enable voltages may be applied to the word lines. Operation 606 may include controlling the timing of the various signals.

Operation 606 may include charging up (e.g., increasing the voltage of) a channel of the memory string from both the source and the drain end, and setting a low voltage such as 0 V on the word lines connected to the control gates of the memory cells. In some implementations, charging up the channels includes applying a suitable voltage to the drain side and/or the source side select gates to generate GIDL current.

Operation 608 includes performing an erase verify test for a NAND string. Typically, this involves setting an erase verify voltage (e.g., Vme) to the word lines that are connected to control gates of memory cells on the string while sensing a current in the memory string. If the current is sufficiently high, the NAND string is considered to pass the verify test. If the NAND string passes the erase verify test at decision operation 610, the erase operation is completed, at operation 612. If the NAND string does not pass the erase verify test at decision operation 610, the process continues at operation 614.

Operation 614 includes a determination of whether the select gate voltage is to be incremented. If so, then the select gate voltage is incremented in operation 616. Whether or not the select gate voltage is incremented, the erase voltage is incremented in operation 618. Then, the next iteration of the erase procedure is performed by returning to operation 606. An erase iteration (or loop) typically involves applying erase conditions followed by performing a verify test, although in some cases the verify test is omitted.

Figure 7:
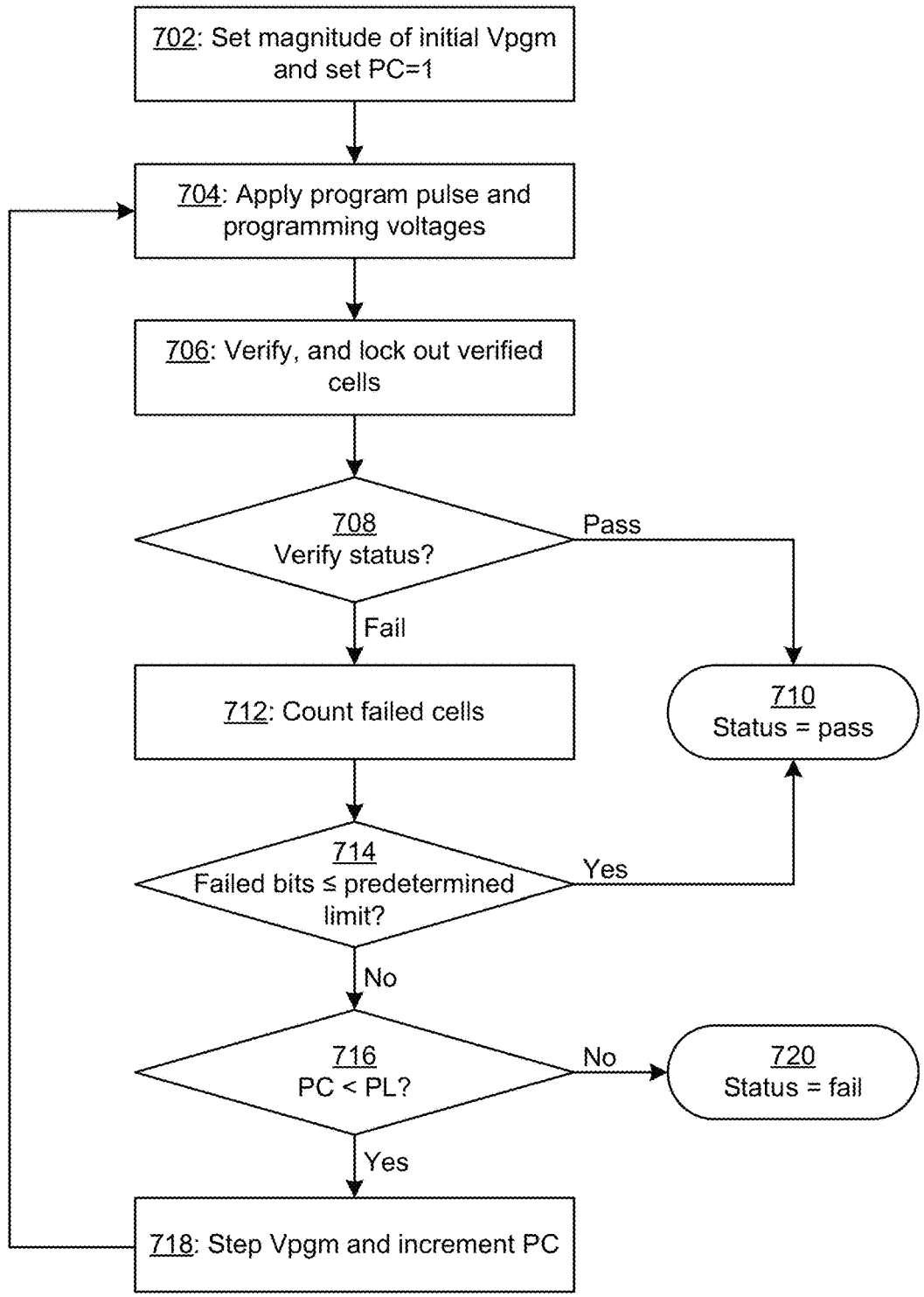
FIG. 7 is a flowchart depicting a process for performing programming operations on a plurality of memory cells in accordance with some implementations.

FIG. 7 is a flowchart depicting a process 700 for performing programming operations on a plurality of memory cells in accordance with some implementations. Process 700 is performed by the storage medium 104 in response to instructions, data and one or more addresses from the storage controller 102. Process 700 can also be used to implement the full sequence programming discussed above. Process 700 can also be used to implement each phase of a multi-phase programming operation. Additionally, process 700 can be used to program memory cells connected to the same word line. In some implementations, the storage controller 102 instructs the storage medium 104 which word line (as well as which block or sub-block) should be programmed. Thus, the storage controller 102 is able to manage the order in which word lines are programmed.

Typically, the program voltage applied to the control gates (via a selected word line) during a program operation is applied as a series of program pulses. Between programming pulses are a set of verify pulses to perform verification. In some implementations, the magnitude of the program pulses is increased with each successive pulse by a predetermined step size.

In operation 702, the programming voltage (Vpgm) is initialized to the starting magnitude (e.g., ~12-16V or another suitable level) and a program counter PC maintained by the state machine is initialized at 1.

In operation 704, a program pulse of the program signal Vpgm is applied to the selected word line (the word line selected for programming). In some implementations, the group of memory cells being programmed concurrently are all connected to the same word line (the selected word line). The unselected word lines receive one or more boosting voltages (e.g., ~7-11 volts) to perform one or more boosting schemes.

As discussed above with reference to FIG. 4E, when a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476 (the programming voltage Vpgm). The threshold voltage (Vth) of the memory cell is increased in proportion to the amount of stored charge. The programming may be achieved through FN tunneling of the electrons into the charge trapping layer. For FN tunneling to occur, a high electric field is necessary across the charge trapping layer 473 and the channel 471. This high electric field is achieved by setting the word line of the memory cell to a high voltage Vpgm, and biasing the bit line of the memory cell to ground.

Thus, if a memory cell is selected to be programmed, then the bit line corresponding to the memory cell is grounded while the word line corresponding to the memory cell is subjected to program pulses of the program signal Vpgm.

On the other hand, if a memory cell associated with an asserted word line is not selected to be programmed, then the bit line corresponding to the memory cell is driven high (e.g., connected to Vdd) to prevent FN tunneling, thereby inhibiting programming.

In some implementations, as described in more detail below, driving the bit line corresponding to the memory cell to a level higher than ground but lower than logic high may allow the memory cell to be programmed, although at a slower rate.

In operation 704, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line concurrently have their threshold voltage change, unless they have been locked out from programming.

In operation 706, the appropriate memory cells are verified using the appropriate set of verify reference voltages to perform one or more verify operations. In some implementations, the verification process is performed by testing whether the threshold voltages of the memory cells selected for programming have reached the appropriate verify reference voltage. Memory cells selected for programming that have reached the appropriate verify reference voltage are locked out from subsequent programming pulses of the current programming operation.

In operation 708, it is determined whether all the memory cells have reached their target threshold voltages (pass). If so, the programming process is complete and successful because all selected memory cells were programmed and verified to their target data states. A status of "PASS" is reported in operation 710. If, in 708, it is determined that not all of the memory cells have reached their target threshold voltages (fail), then the programming process continues to operation 712.

In operation 712, the system counts the number of memory cells that have not yet reached their respective target threshold voltage distribution. That is, the system counts the number of memory cells that have, so far, failed the verify process. This counting can be done by the state machine 312, the storage controller 102, or other logic. In one implementation, each of the sense blocks store the status (pass/fail) of their respective cells. In some implementations, there is one total count, which reflects the total number of memory cells currently being programmed that have failed the last verify operation. In some implementations, separate counts are kept for each data state.

In operation 714, it is determined whether the count from operation 712 is less than or equal to a predetermined limit. In some implementations, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in operation 710. In this situation, enough memory cells programmed correctly such that the few remaining memory cells that have not been completely programmed can be corrected using ECC during the read process. In some implementations, operation 712 counts the number of failed cells for each page, each target data state or other unit, and those counts individually or collectively are compared to a threshold in operation 714.

In some implementations, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some implementations, the limit is not predetermined. Instead, it changes based on the number of errors already counted for the page, the number of program/erase cycles performed or other criteria.

If the number of failed memory cells is not less than the predetermined limit, than the programming process continues at operation 716 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in operation 720. This is one example of a program fault. If the program counter PC is less than the program limit value PL, then the process continues at operation 718 during which time the program counter PC is incremented by 1 and the program voltage Vpgm is stepped up to the next magnitude. For example, the next pulse has a magnitude greater than the previous pulse by a step size (e.g., a step size of 0.1-0.5 volts). After operation 718, the process loops back to operation 704 and another program pulse is applied to the selected word line so that another iteration (operations 704-718) of the programming process 700 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5A) or verify operation (e.g. see verify reference voltages Vv1, Vv2, Vv3, Vv4, Vv5, Vv6, and Vv7 of FIG. 5A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods for verifying/reading. Other read and verify techniques can also be used.

In some implementations, the storage controller 102 receives a request from the host (or a client, user, etc.) to program host data (data received from the host) into the memory system. In some implementations, the storage controller 102 arranges the host data to be programmed into units of data. For example, the storage controller 102 can arrange the host data into pages, partial pages (a subset of a page), word line units, blocks, jumbo blocks, or other units.

Figure 8A:
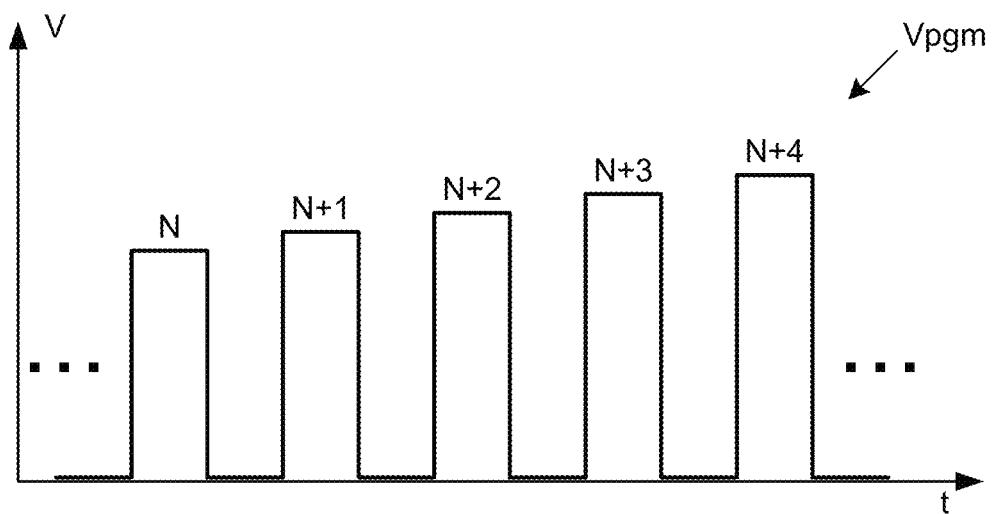
FIG. 8A depicts an example program signal as described with reference to operation 704 in FIG. 7 in accordance with some implementations.

FIG. 8A depicts an example program signal Vpgm as described above with reference to operation 704 in accordance with some implementations. The program signal Vpgm includes a plurality of program pulses, including pulse N, pulse N+1, pulse N+2, and so forth. The magnitude of the program pulses may be increased with each successive pulse by a predetermined step size.

Figure 8B:
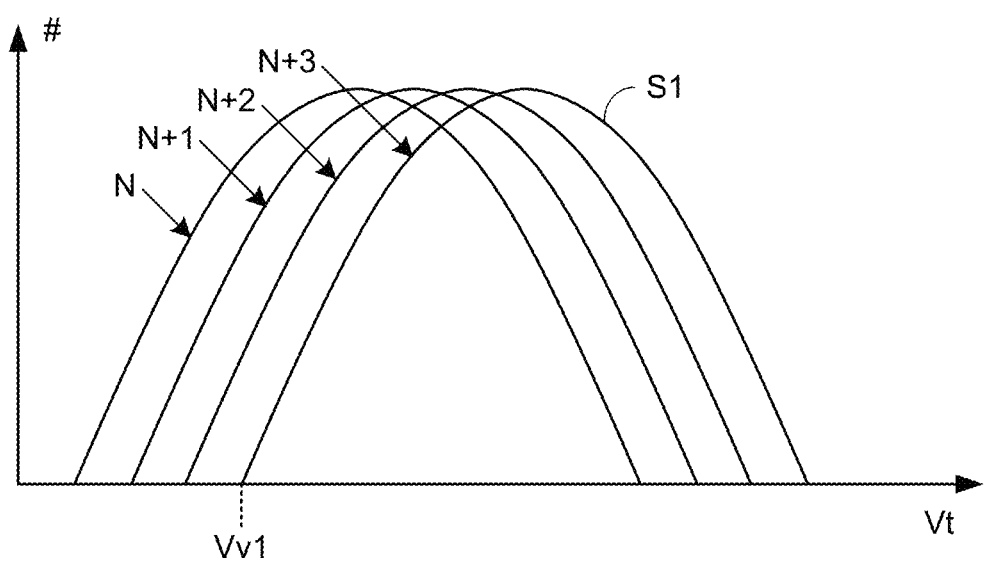
FIG. 8B depicts a voltage distribution as described with reference to FIGS. 5A-5C as the associated memory cells are subjected to successive programming pulses in accordance with some implementations.

FIG. 8B depicts a voltage distribution S1 (as described with reference to FIGS. 5A-5C) as the associated memory cells are subjected to successive programming pulses. The program pulses correspond to those depicted in FIG. 8A. With each successive program pulse, the threshold voltages of the memory cells associated with the voltage distribution S1 increase, thereby causing the successive distribution curves to move to the right. After each program pulse, control circuitry of the storage medium 104 tests (e.g., performs sense operations) the memory cells associated with the S1 state to determine whether the memory cells have a threshold voltage greater than or equal to Vv1 (as described above with reference to FIG. 5A and operation 706 in FIG. 7). If a threshold of the memory cells do not have a voltage threshold above Vv1 (e.g., as a result of pulse N), then the next program pulse is applied (e.g., pulse N+1) to the memory cells. When at least a threshold (e.g., determined by ECC capabilities of the storage controller 102 as described above) of memory cells have a threshold voltage greater than or equal to Vv1, the program operation for those memory cells is complete.

As described above, each program operation (e.g., 704, FIG. 7) is followed by a verify operation (e.g., 706, FIG. 7). With each successive program pulse Vpgm, the threshold voltage Vt of the cells of a given distribution curve increase, causing the curve to move to the right of a distribution vs. Vt graph (such as that depicted in FIG. 8B). The verify operation determines which cells in a given distribution curve have a threshold voltage that meets the verify reference Vv1 (sometimes referred to as the destination reference) (e.g., cells to the right of Vv1 in a distribution vs. Vt graph), and which cells do not have a threshold voltage that meets the verify reference Vv1 (e.g., cells to the left of Vv1 in a distribution vs. Vt graph). For cells that have reached the destination reference Vv1, those cells may be locked out of subsequent programming, causing subsequent programming pulses to no longer affect the threshold voltage Vt of those cells. For cells that have not reached the destination reference Vv1, those cells may be subjected to additional program pulses Vpgm until the threshold voltages Vt have reached the destination reference Vv1.

Each successive program pulse Vpgm requires additional power to be consumed. As such, in order to optimize power consumption during programming operations, it is advantageous to minimize the amount of power consumed for each program pulse. One way to minimize power consumption for a program pulse is to decrease the amount of power used on cells that are relatively close to reaching the destination threshold Vv1 and/or increase the amount of power used on cells that are relatively far from reaching the destination threshold Vv1.

In addition, if a program pulse pushes a cell too far to the right of the distribution vs. Vt graph, the cell may overshoot the destination distribution (e.g., S1). Due to physical differences in the implementation of individual memory cells in the memory array 350, some cells may be more or less sensitive to program pulses than other cells. As such, some cells may farther to the right, or not as far to the right, of the distribution vs. Vt graph compared to other cells.

Fast moving cells (cells that are relatively more sensitive to program pulses) may become over-programmed (e.g., cell D in FIG. 9). As a result, such cells may be pushed to the right of the destination distribution (e.g., S1). At this point, such cells cannot be brought back to the destination distribution. In other words, the Vt of such cells may be so high that the cells are in the next distribution, causing the cells to represent the wrong data. This may result in errors or extra programming steps (e.g., involving erasing and repeating programming operations). For such cells, it may be advantageous from an accuracy optimization perspective to apply relatively low program pulses in order to prevent the cells from overshooting the destination distribution.

Slow moving cells (cells that are relatively less sensitive to program pulses) may result in the need for additional program pulses, thereby causing more power to be necessary to push such cells into the destination distribution (e.g., S1). For such cells, it may be advantageous from both power and performance optimization perspectives to apply a higher program pulse than several lower program pulses, because they still have a long way to go before reaching the destination distribution.

In order to determine which cells are slow moving and which cells are fast moving, and thereby determine which cells may be subjected to a higher pulse voltage or a lower pulse voltage for a given program pulse (e.g., for N+1), verify operations may compare the threshold voltage Vt of memory cells to more than one reference voltage.

Figure 9A:
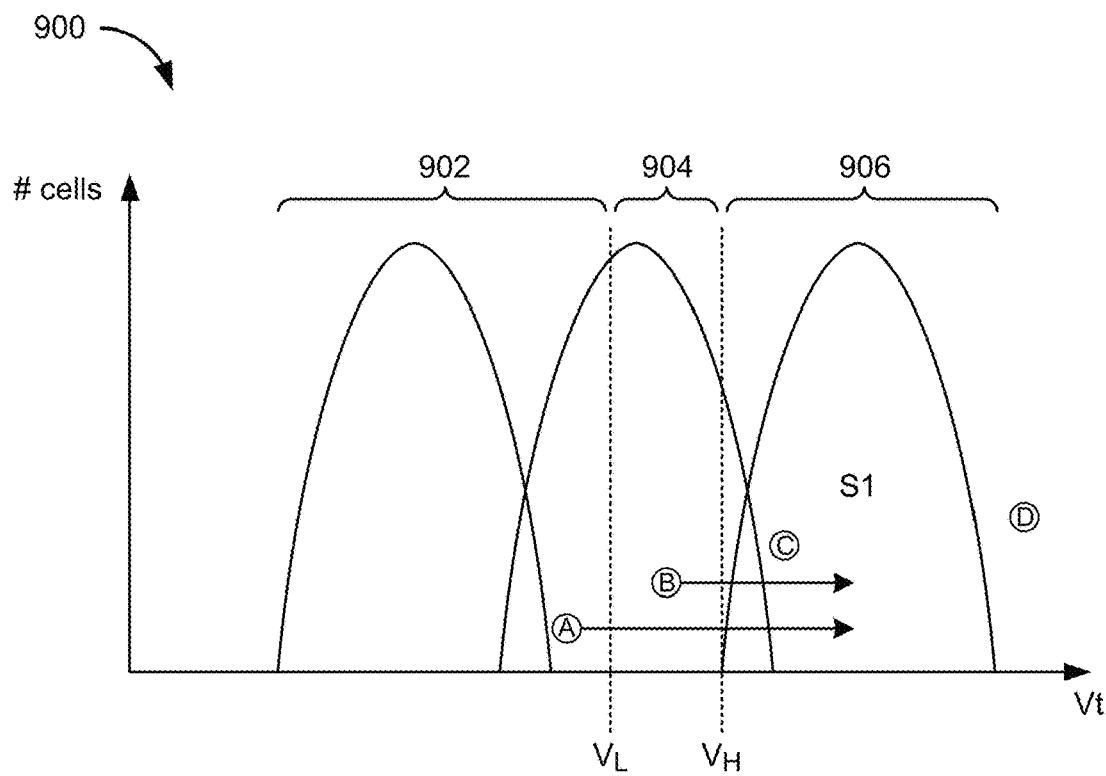
FIG. 9A depicts an example program/verify scheme in which more than one reference voltage is used during the verify operation for a given program pulse, in accordance with some implementations.

FIG. 9A depicts an example program/verify scheme 900 in which more than one reference voltage is used during the verify operation for a given program pulse, in accordance with some implementations. Here, S1 is the destination distribution, and the distributions to the left represent either intermediate distributions (e.g., those depicted in FIG. 8B), or distributions for lower program states (e.g., S0 in FIG. 5A). The destination verify reference voltage (for destination distribution S1) is labeled $V_H$ (high reference verification level) and an additional verify reference voltage is labeled $V_L$ (low reference verification level). The additional verify reference voltage $V_L$ is less than the destination verify reference voltage $V_H$. After a given program pulse (e.g., N, FIG. 8A), the voltage threshold Vt of memory cells subjected to the program pulse is in one of three zones 902, 904, or 906.

In the first zone 902, Vt is less than $V_L$. For cells in the first zone (e.g., cell A), the next program pulse (N+1) may be higher than that for cells in the second zone 904, since the Vt of cells in the first zone 902 is farther away from reaching the destination reference $V_H$. In other words, cells in the first zone 902 are farther from the destination distribution S1 as compared to cells in the second zone 904. As such, the relatively high program pulse applied to cells in the first zone 902 causes those cells to travel farther to the right on the distribution vs. Vt graph.

In the second zone 904, Vt is greater than or equal to $V_L$ and less than $V_H$. For cells in the second zone (e.g., cell B), the next program pulse (N+1) may be lower than that for cells in the first zone 902, since the Vt of cells in the second zone 904 is closer to reaching the destination reference $V_H$. In other words, cells in the second zone 904 are closer to the destination distribution S1 as compared to cells in the first zone 904. As such, the relatively low program pulse applied to cells in the second zone 904 causes those cells to travel a smaller distance to the right on the distribution vs. Vt graph compared to the distance traveled by cells in the first zone 902. Applying smaller program pulses to cells in the second zone 904 not only saves power, but makes such program pulses less likely to cause the cells to overshoot the destination distribution S1.

In the third zone 906, Vt is greater than or equal to $V_H$. Cells in the third zone (e.g., cell C) may be locked out of receiving or otherwise being affected by subsequent program pulses (N+1 and beyond). In other words, cells in the third zone 906 may be inhibited from subsequent programming (e.g., by applying a supply voltage signal to bit lines associated with such memory cells, thereby preventing subsequent program pulses from further programming such cells).

Figure 9B:
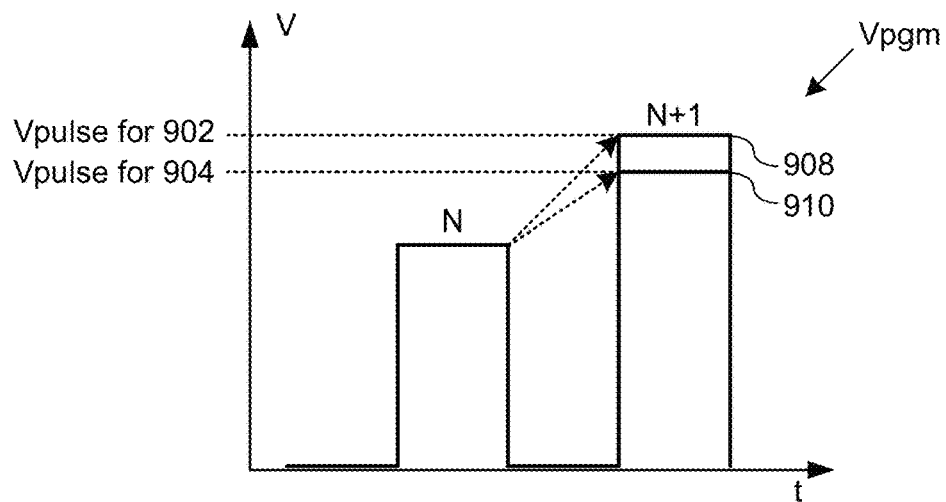
FIG. 9B depicts an example succession of program pulses, including a first pulse N and a second pulse N+1 subsequent to the first pulse, in accordance with some implementations.

FIG. 9B depicts an example succession of program pulses, including a first pulse N and a second pulse N+1 subsequent to the first pulse, in accordance with some implementations. For the second pulse N+1, a higher pulse voltage (Vpulse) 908 may be applied to cells located in the first region 902 as a result of the previous program pulse N, and a lower pulse voltage 910 may be applied to cells located in the second region 904 as a result of the previous program pulse N, as described above. In some implementations (not depicted in the figures), rather than adjusting the value of the pulse voltage, the same pulse voltage value may be applied to cells in both regions 902 and 904, but cells in the second region 904 may be partially inhibited from being programmed (e.g., by applying an inhibiting voltage to the bit lines associated with such cells, the inhibiting voltage being greater than zero and less than a supply voltage). Thus, the program pulse voltage may affect cells in the first region 902 differently from cells in the second region 904 (in the manner described above).

To implement the program/verify scheme 900, each verify operation (706, FIG. 7) checks for $V_L$ and $V_H$ conditions. Each check may be referred to as a phase of a given verify operation.

In the first phase, the verify operation determines whether the voltage thresholds Vt of a plurality of memory cells (associated with a distribution of cells being programmed to represent a given state, e.g., S1) meet, or fail to meet, a first verify reference threshold $V_L$. Cells having a threshold voltage Vt below the first verify reference threshold $V_L$ may be subjected to a subsequent program pulse (908) that is higher than that of cells having a threshold voltage Vt that meets the first verify reference threshold $V_L$.

In the second phase, the verify operation determines whether the voltage thresholds Vt of the plurality of memory cells (associated with the distribution of cells being programmed to represent the given state, e.g., S1) meet, or fail to meet, a second verify reference threshold $V_H$. Cells having a threshold voltage Vt below the second verify reference threshold $V_H$ (but higher than $V_L$) may be subjected to a subsequent program pulse that is lower (910) than that of cells having a threshold voltage Vt that is lower than the first verify reference threshold $V_L$.

Figure 10A:
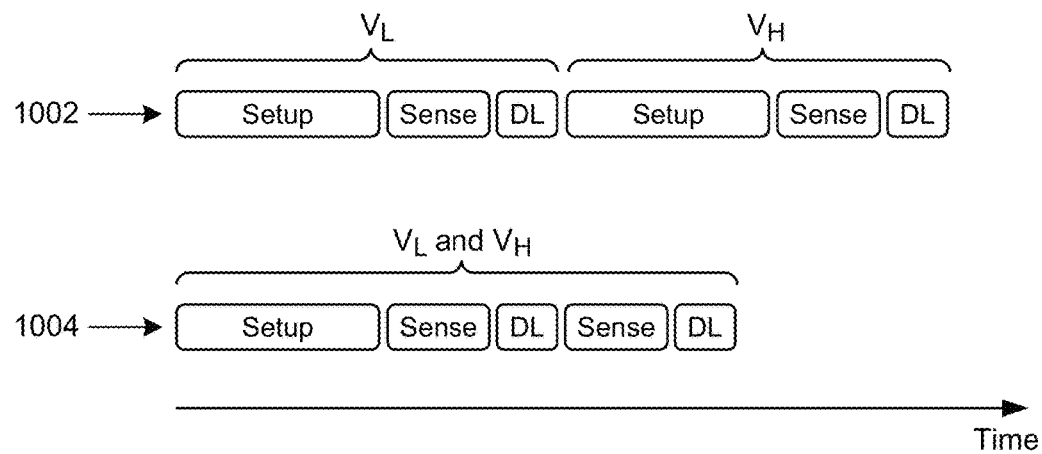
FIG. 10A is a timing diagram depicting two scenarios of a verify operation with two sensing operations in accordance with some implementations.

FIG. 10A is a timing diagram depicting two scenarios 1002 and 1004 of a verify operation with two sensing operations in accordance with some implementations. In each scenario, two sequential sensing operations are performed to distinguish cells for $V_L$ and $V_H$ levels.

The first scenario 1002 comprises two separate verify operations (one for $V_L$ sensing and one for $V_H$ sensing), with each verify operation comprising its own setup time and sensing operation. For each verify operation, setup time is required to prepare for sensing. Example setup operations may include bit line (BL) settling time, word line settling time, sensing circuitry pre-charge time (e.g., the time it takes to charge a sensing capacitor C1 depicted in FIG. 11A below), clock ramp-up time, and so forth. When setup time is complete for the first operation, $V_L$ sensing may take place, following by transferring of data (the result of the $V_L$ sensing) to a data latch DL. The sensing operation is repeated again for $V_H$ sensing, including additional setup time. The additional setup time is required (in this scenario) to bring the sensing circuits back to their initial state (to the state they were in at the beginning of the $V_L$ sensing operation). The timing depicted in FIG. 10A is not necessarily to scale for all implementations; rather, the focus is on the order of operations.

The second scenario 1004 comprises a single verify operation, which includes a single instance of setup time and sensing for both $V_L$ and $V_H$ levels. In other words, the verify operation in the second scenario 1004 completes sensing of cells at $V_L$ and $V_H$ levels in a single cycle. The second scenario 1004 results in higher performance, since the second sensing operation (for $V_H$ levels) may be performed without having to wait for additional setup operations to be performed. Such additional setup operations may be referred to as overhead, and it is advantageous to avoid such overhead when optimizing for performance.

Figure 10B:
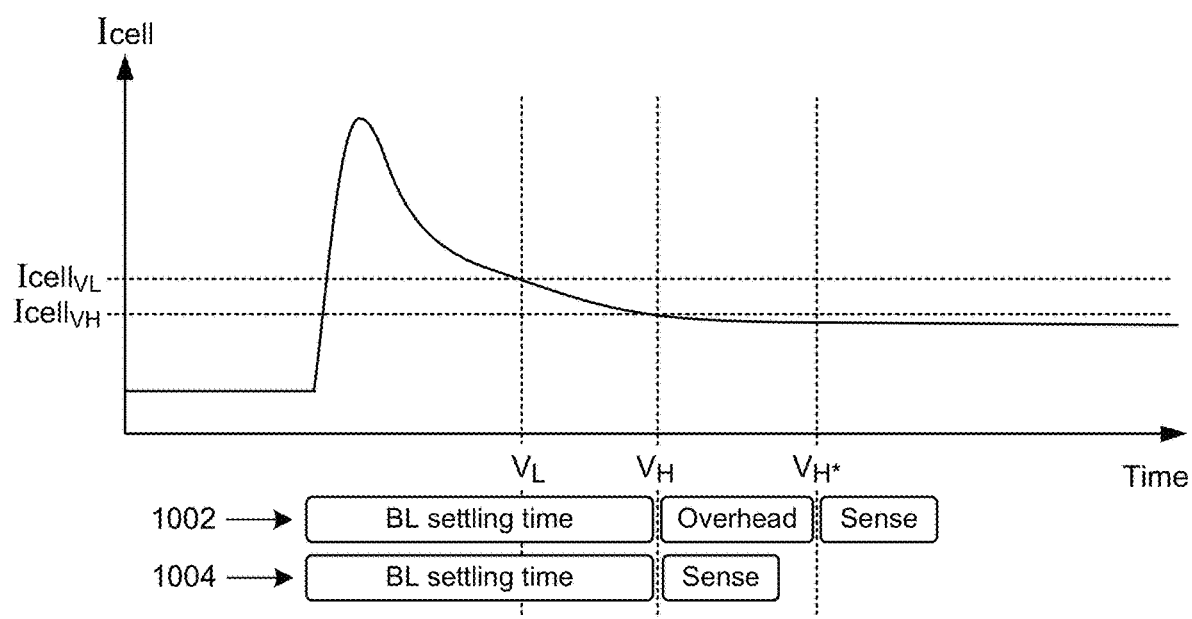
FIG. 10B depicts a graph of memory cell current over time during verify operations in accordance with some implementations.

FIG. 10B depicts a graph of memory cell current over time during verify operations in accordance with some implementations. The graph in FIG. 10B depicts the two scenarios 1002 and 1004 relative to setup time, also referred to as bit line (BL) settling time (but not restricted to BL settling time). During a given verify operation, a voltage is applied to the bit lines of memory cells being verified. This voltage causes current (Icell) to flow through the cell. After the initial application of voltage, Icell rises to a peak level, then decreases to a final level over time. As shown in the graph, $V_L$ sensing may occur as soon as Icell decreases to a first level Icell$_{VL}$, and $V_H$ sensing may occur as soon as Icell decreases to a second level Icell$_{VH}$ lower than the first level.

In both scenarios 1002 and 1004, $V_L$ sensing may be performed during the BL settling time. However, in the first scenario 1002, the sensing circuitry requires additional time (overhead) to prepare for $V_H$ sensing (the second setup time in FIG. 10A). As such, in the first scenario 1002, $V_H$ sensing may not occur until later (at time $V_{H*}$). In the second scenario 1004, however, $V_H$ sensing can be performed as soon as the BL settling time is complete. As advancements in memory array 350 design allow for bit lines to be shorter, the BL settling time decreases. As a result of shorter bit lines, BL setting time decreases (since Icell decreases more quickly), which causes the distance between $V_L$ and $V_H$ to decreases, thus increasing the need to shorten the overhead time. Without shortening the overhead time, the setup time for $V_H$ sensing (as depicted in the first scenario 1002) could act as a performance bottleneck as the distance between $V_L$ and $V_H$ decreases.

Figure 11A:
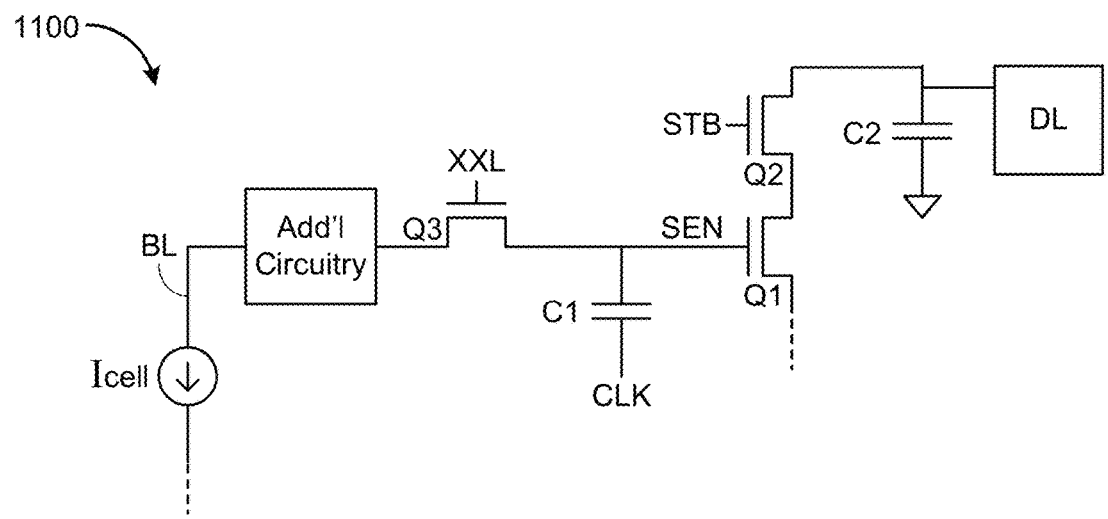
FIG. 11A is a diagram of sensing circuitry in accordance with some implementations.

FIG. 11A is a diagram of sensing circuitry 1100 (e.g., included in sense blocks 370, FIG. 3) in accordance with some implementations. The sense blocks 370 include multiple sensing circuits 1100, and each sensing circuit 1100 is coupled to a bit line (BL) 425 (see FIG. 4F). There may be additional circuitry, including circuitry for pre-charging the bit lines and circuitry for biasing the various signals and modulating the various clock levels. For purposes of brevity and so as not to obscure the inventive concepts, such additional circuitry is not discussed further.

The sensing circuitry 1100 includes a sensing node SEN, two transistors Q1 and Q2 that selectively allow a capacitor C2 to charge depending on the amount of cell current Icell detected during a sense operation. The charge at capacitor C2 is transferred as sense information to a data latch DL. To charge the capacitor C2, transistors Q1 and Q2 are selectively operated by the sensing node SEN and a strobe signal STB. The sensing node SEN is affected by the amount of charge on a capacitor C1 that is selectively coupled to a clock signal CLK, and selectively coupled to a bit line BL of a memory cell via a sense control transistor Q3 (operated by a control signal XXL).

Figure 11B:
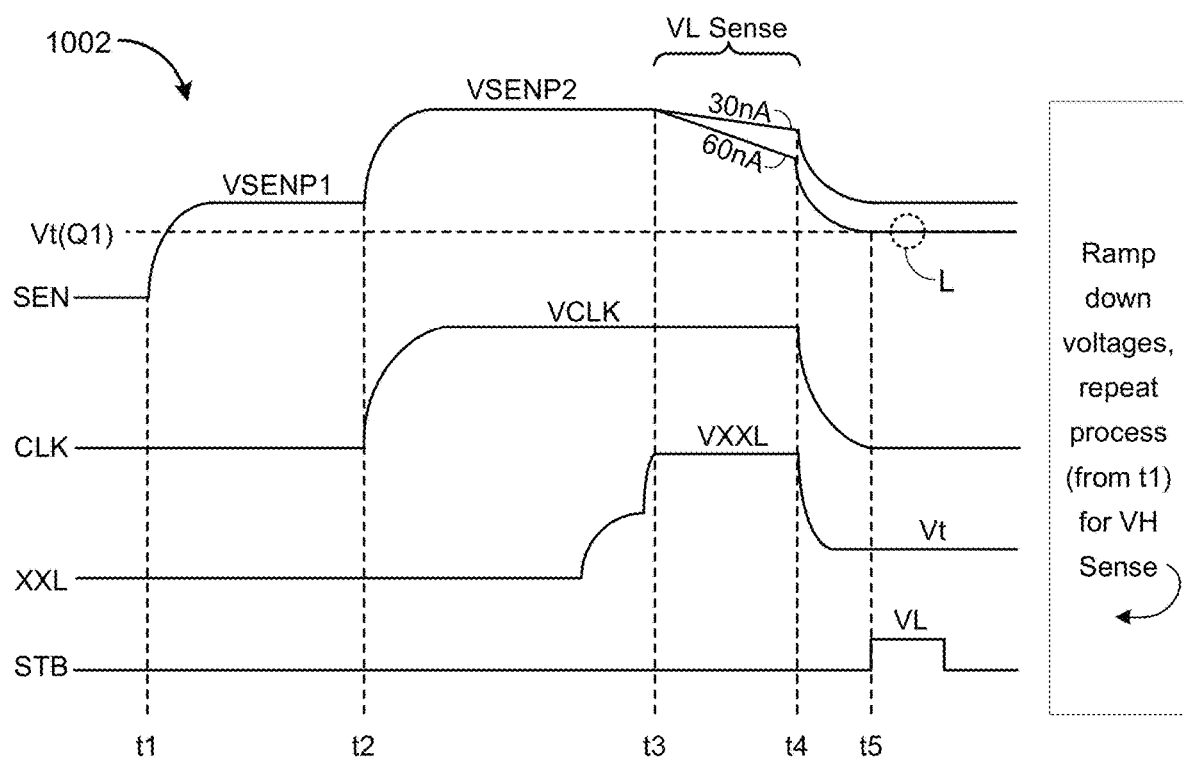
FIG. 11B is a timing diagram associated with sensing operations of the sensing circuitry in FIG. 11A in accordance with some implementations.

FIG. 11B is a timing diagram associated with sensing operations of the sensing circuitry 1100 in accordance with some implementations. The timing diagram depicted in FIG. 11B corresponds to the first sensing scenario 1002 (FIGS. 10A-10B). For a given sensing operation, the sensing node SEN initially pre-charges to a first level VSENP1 (e.g., equal to a supply voltage Vdd available to the sensing circuitry) at time t1.

At time t2, the clock signal CLK goes high (to a level VCLK), causing the sensing node SEN to increase to a second level VSENP2, which is equal to VSENP1+ CR*VCLK, where CR is the coupling ratio of the capacitor C1.

At time t3, the sensing control signal XXL ramps up to VXXL, turning on transistor Q3, which closes a path between capacitor C1 and the bit line BL. As a result of transistor Q3 being turned on at time t3, capacitor C1 discharges at a rate that is based on the cell current Icell, which in turn is based on how much the cell is programmed. More specifically, as a result of Q3 being turned on at time t3, C1 discharges at a rate that is affected by the amount of charge stored in the charge trapping layer 473 of the cell (e.g., for a 3D memory array, see FIG. 4E), or based on the amount of charge stored in the floating gate (e.g., for a 2D memory array). The more charge in the charge trapping layer (or in the floating gate), the lower the discharge rate of C1, due to the lower cell current Icell.

As long as the control signal XXL remains high, transistor Q3 provides a path for current to flow through the bit line, discharging capacitor C1. As capacitor C1 discharges, voltage at the sensing node SEN decreases at a rate corresponding to the discharge of current (which is based on the amount the cell is programmed). The amount of time that the control signal XXL remains high (between times t3 and t4) may be referred as the sense time. The length of the sense time may be determined using the sense time length equation: $CV = \int i\, dt$, where C is the capacitance of capacitor C1, V is the amount of voltage swing on the sensing node SEN (e.g., a 1V swing may be targeted), i is the target cell current, and t is the sense time. If performing a $V_L$ sense, $Icell_{VL}$ (FIG. 10B) may be targeted, and if performing a VH sense, $Icell_{VH}$ (FIG. 10B) may be targeted. As an example, $Icell_{VL}$ may be 60 nA, and $Icell_{VH}$ may be 30 nA. However, other Icell target values may be used (e.g., greater than 60 nA, between 30 nA-60 nA, or less than 30 nA) depending on characteristics of the destination distribution (e.g., S1) or characteristics of the cells in the memory array 350.

During the sensing time (between t3 and t4), voltage at the sensing node SEN decreases at a rate corresponding to the amount the cell is programmed, as described above. FIG. 11B depicts two such cases—one corresponding to a 60 nA cell current (for $V_L$ sense), and one corresponding to a 30 nA cell current (for $V_H$ sense). These two cases are depicted to illustrate the inventive concepts, and are not limiting.

At time t4 (determined by the sense time length equation above), the control signal XXL is ramped down, along with the clock signal CLK, which causes the voltage at the sensing node SEN to settle and eventually float. If this floating voltage reaches the threshold voltage Vt of the transistor Q1, then the floating voltage causes transistor Q1 to turn on. The timing of the sense time is determined such that a targeted Icell value causes the floating voltage at time t5 to reach the threshold voltage Vt of transistor Q1. In other words, if the cell current Icell equals a targeted value (e.g., 60 nA for $V_L$ sense), then the floating voltage at time t5 causes transistor Q1 to turn on. Conversely, if the cell current Icell equals a value (e.g., 30 nA) other than the targeted value, then the floating voltage at time t5 does not cause transistor Q1 to turn on.

At time t5, a strobe signal STB causes transistor Q2 to turn on. If the cell current Icell was the target value (e.g., 60 nA for $V_L$ sense), then the floating voltage at the sensing node SEN reaches the threshold voltage Vt of the sensing transistor Q1 (at the point labeled L in the figure), thereby causing Q1 to turn on. As a result, both Q1 and Q2 are on, providing a path for voltage to charge capacitor C2 (and thereby transfer to the data latch DL). Conversely, if the cell current Icell was not the targeted value (e.g., 30 nA for $V_L$ sense), then the floating voltage at the sensing node SEN does not reach the threshold voltage Vt of the sensing transistor Q1, thereby preventing Q1 from turning on. As a result, there is no path for voltage to charge capacitor C2 (and thus, nothing is transferred to the data latch DL). As a result, the data latch DL stores information regarding whether the cell current Icell met or did not meet the targeted value during the sense time. In other words, the data latch DL stores a voltage if Icell met the targeted value during the sense time (e.g., if the cell has a threshold voltage Vt of at least $V_L$, putting the cell in zone 904, FIG. 9A), and does not store a voltage if Icell did not meet the targeted value during the sense time (e.g., if the cell does not have a threshold voltage Vt of at least $V_L$, putting the cell in zone 902, FIG. 9A).

After strobing the STB signal at t5 and transferring information to the data latch DL as described above, $V_L$ sensing is complete, and the sense circuitry 1100 resets for $V_H$ sensing. As described above, resetting the sense circuitry 1100 (setup time) includes discharging signals SEN, CLK, XXL, and STB, bit line settling, word line settling, and so forth.

When the sense circuitry 1100 has completed resetting, the operations described above are repeated, beginning at time t1, for $V_H$ sensing. Specifically, beginning at time t1, the sensing node SEN initially pre-charges to the first level VSENP1. At time t2, the clock signal CLK goes high (to a level VCLK), causing the sensing node SEN to increase to the second level VSENP2. At time t3, the sensing control signal XXL ramps up to VXXL, turning on transistor Q3, which closes a path between capacitor C1 and the bit line BL. Capacitor C1 discharges at a rate that is based on the cell current Icell, which in turn is based on how much the cell is programmed.

As capacitor C1 discharges, voltage at the sensing node SEN decreases at a rate corresponding to the discharge of current (which is based on the amount the cell is programmed). The sensing time (between t3 and t4) in FIG. 11B depicts a sense time for $V_L$ sensing (corresponding to, e.g., 60 nA cell current). For $V_H$ sensing, however, the sense time is increased, thereby allowing enough time for cells corresponding, e.g., 30 nA cell current, to discharge to a level that the floating SEN voltage would register at time t5 (not depicted in the figure).

Thus, time t4 for $V_H$ sensing comes later than time t4 for $V_L$ sensing. At time t4, the control signal XXL is ramped down, along with the clock signal CLK, which causes the voltage at the sensing node SEN to settle and eventually float. If this floating voltage reaches the threshold voltage Vt of the transistor Q1, then the floating voltage causes transistor Q1 to turn on. The timing of the sense time is determined such that a targeted Icell value causes the floating voltage at time t5 to reach the threshold voltage Vt of transistor Q1. In other words, if the cell current Icell equals a targeted value (e.g., 30 nA for $V_H$ sense), then the floating voltage at time t5 causes transistor Q1 to turn on. Conversely, if the cell current Icell equals a value other than the targeted value, then the floating voltage at time t5 does not cause transistor Q1 to turn on.

At time t5, the strobe signal STB causes transistor Q2 to turn on. If the cell current was the target value (e.g., 30 nA for $V_H$ sense) causing the floating SEN voltage to turn Q1 on, then both Q1 and Q2 are on, providing a path for voltage to charge capacitor C2 (and thereby transfer to the data latch DL). Conversely, if the cell current Icell was not the targeted value resulting in Q1 remaining off, then there is not a path for voltage to charge capacitor C2 (and thus, nothing is transferred to the data latch DL). As a result, the data latch DL stores information regarding whether the cell current Icell met or did not meet the targeted value during the sense time. In other words, the data latch DL stores a voltage if Icell met the targeted value during the sense time (e.g., if the cell has a threshold voltage Vt of at least $V_H$, putting the cell in zone 906, FIG. 9A), and does not store a voltage if Icell did not meet the targeted value during the sense time (e.g., if the cell does not have a threshold voltage Vt of at least $V_H$, putting the cell in zone 904, FIG. 9A).

Based on the value in the data latch DL (i.e., based on whether the sense circuitry 1100 determines the cell is in the first zone 902, the second zone 904, or the third zone 906, FIG. 9A), a determination may be made regarding whether to program the cell (and if so, how much to program the cell) in a subsequent program operation as described above.

The sensing scenario 1002 depicted in FIG. 11B requires two separate sensing operations to compare threshold voltages of memory cells in a particular distribution to $V_L$ and $V_H$ (thereby determining whether the cells are in zone 902, 904, or 906, FIG. 9B). Many steps in these operations are redundant, and the extra time required to reset the sensing circuitry 1100 negatively affects performance, as described above with reference to FIG. 10B (scenario 1002).

Figure 12A:
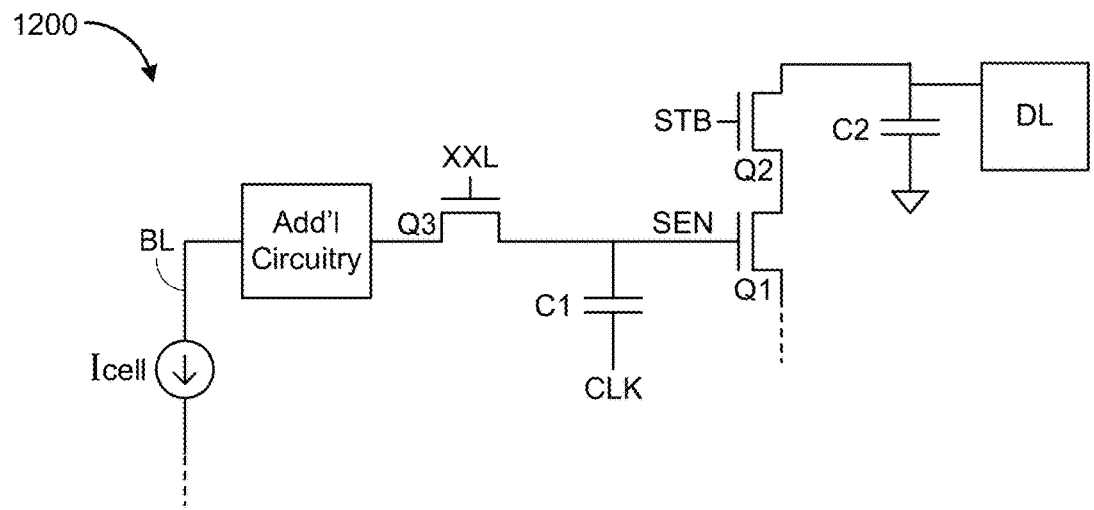
FIG. 12A is a diagram of sensing circuitry in accordance with some implementations.

FIG. 12A is a diagram of sensing circuitry 1200 (e.g., included in sense blocks 370, FIG. 3) in accordance with some implementations. The sense blocks 370 include multiple sensing circuits 1200, and each sensing circuit 1200 is coupled to a bit line (BL) 425 (see FIG. 4F). There may be additional circuitry, including circuitry for pre-charging the bit lines and circuitry for biasing the various signals and modulating the various clock levels. For purposes of brevity and so as not to obscure the inventive concepts, such additional circuitry is not discussed further.

Similar to the sensing circuitry 1100, the sensing circuitry 1200 includes a sensing node SEN, two transistors Q1 and Q2 that selectively allow a capacitor C2 to charge depending on the amount of cell current Icell detected during a sense operation. The charge at capacitor C2 is transferred as sense information to a data latch DL. To charge the capacitor C2, transistors Q1 and Q2 are selectively operated by the sensing node SEN and a strobe signal STB. The sensing node SEN is affected by the amount of charge on a capacitor C1 that is selectively coupled to a clock signal CLK, and selectively coupled to a bit line BL of a memory cell via a sense control transistor Q3 (operated by a control signal XXL).

Figure 12B:
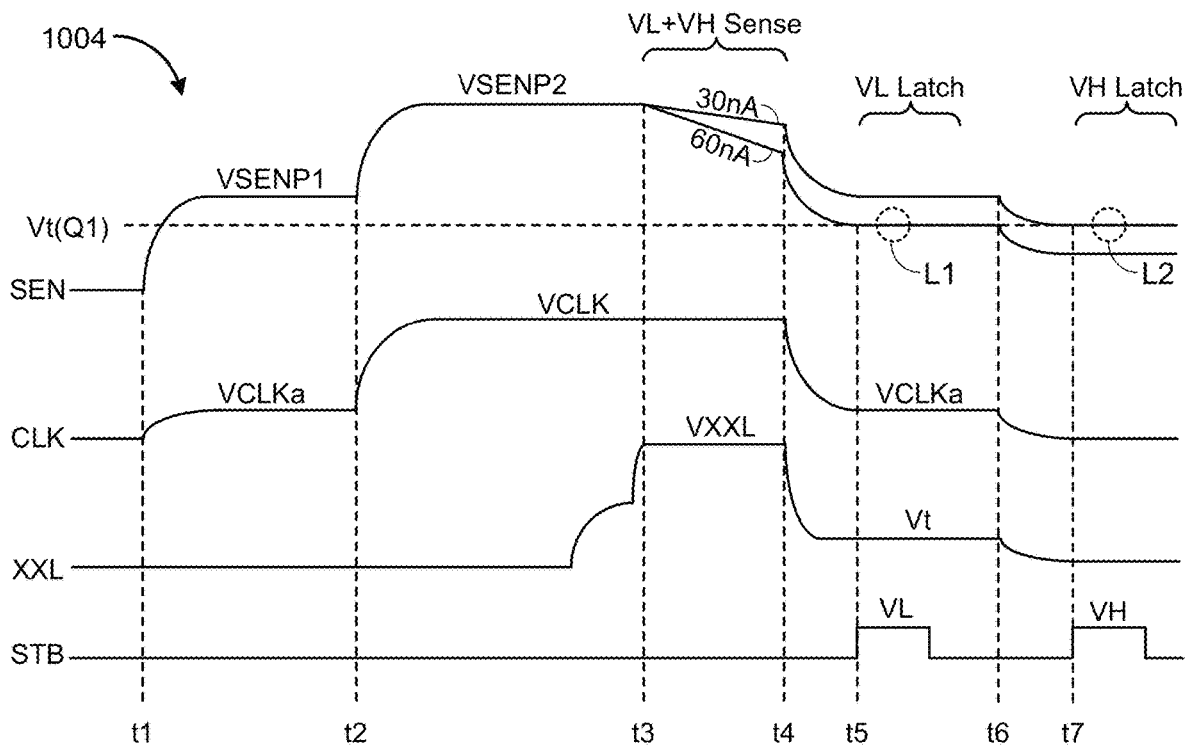
FIG. 12B is a timing diagram associated with sensing operations of the sensing circuitry in FIG. 12A in accordance with some implementations.

FIG. 12B is a timing diagram associated with sensing operations of the sensing circuitry 1200 in accordance with some implementations. The timing diagram depicted in FIG. 12B corresponds to the second sensing scenario 1004 (FIGS. 10A-10B). In this scenario, $V_L$ and $V_H$ sensing are consecutively performed in the same sensing operation, thereby eliminating the overhead time associated with setup time between $V_L$ and $V_H$ sensing (due to no longer having to reset the sensing circuitry or perform pre-sense operations between $V_L$ and $V_H$ sensing), thus increasing performance. In order to implement a single sensing operation for both $V_L$ and $V_H$ sensing, the clock CLK is modulated to distinguish between $V_L$ and $V_H$ levels, as described in more detail below.

For a given sensing operation, the sensing node SEN initially pre-charges to a first level VSENP1 (e.g., equal to a supply voltage Vdd available to the sensing circuitry) at time t1. Concurrent to the initial pre-charging of the sensing node SEN, the clock signal CLK ramps up to an intermediate level VCLKa. In other words, rather than waiting until time t2 to ramp up the clock signal CLK (as discussed above with reference to FIG. 11B), the clock signal CLK ramps up to an intermediate level at time t1, at the same time the sensing node SEN pre-charges. The level at which the clock signal CLK initially ramps up at time t1 is an intermediate level (sometimes referred to herein as a first modulated level). The value of VCLKa is chosen such that the effect of CLK will not be reflected on SEN, so SEN may still pre-charge to the desired level (VSENP1). In addition, the concurrent timing of the VCLKa ramp with the VSENP1 ramp further ensures that the effect of CLK will not be reflected on SEN when ramping up to the desired level (VSENP1).

At time t2, the clock signal CLK goes high, to the level VCLK (sometimes referred to herein as a second modulated level), as described above with reference to FIG. 11B. This causes the sensing node SEN to increase to a second level VSENP2, which is equal to VSENP1+CR*(VCLK−VCLKa), where CR is the coupling ratio of the capacitor C1.

At time t3, the sensing control signal XXL ramps up to VXXL, turning on transistor Q3, which closes a path between capacitor C1 and the bit line BL. As a result of transistor Q3 being turned on at time t3, capacitor C1 discharges at a rate that is based on the cell current Icell, which in turn is based on how much the cell is programmed. More specifically, as a result of Q3 being turned on at time t3, C1 discharges at a rate that is affected by the amount of charge stored in the charge trapping layer 473 of the cell (e.g., for a 3D memory array, see FIG. 4E), or based on the amount of charge stored in the floating gate (e.g., for a 2D memory array). The more charge in the charge trapping layer (or in the floating gate), the lower the discharge rate of C1, due to the lower cell current Icell.

As long as the control signal XXL remains high, transistor Q3 provides a path for current to flow through the bit line, discharging capacitor C1. As capacitor C1 discharges, voltage at the sensing node SEN decreases at a rate corresponding to the discharge of current (which is based on the amount the cell is programmed). The amount of time that the control signal XXL remains high (between times t3 and t4) may be referred as the sense time. The length of the sense time may be determined using the sense time length equation: CV=0.1 i dt, where C is the capacitance of capacitor C1, V is the amount of voltage swing on the sensing node SEN (e.g., a 1V swing may be targeted), i is the target cell current, and t is the sense time.

Rather than targeting $Icell_{VL}$ for a $V_L$ sense operation and $Icell_{VH}$ for a $V_H$ sense operation as described above with reference to scenario 1002 (FIG. 11B), the multiphase verify operation of scenario 1004 (FIG. 12B) targets just one cell current at time t3, which is $Icell_{VL}$. Similar to scenario 1002 as described above, an example $Icell_{VL}$ may be 60 nA, and an example $Icell_{VH}$ may be 30 nA. However, other Icell values may be used (e.g., greater than 60 nA, between 30 nA-60 nA, or less than 30 nA) depending on characteristics of the destination distribution (e.g., S1) or characteristics of the cells in the memory array 350.

During the sensing time (between t3 and t4), voltage at the sensing node SEN decreases at a rate corresponding to the amount the cell is programmed, as described above. FIG. 12B depicts two such cases—one corresponding to a 60 nA cell current, and one corresponding to a 30 nA cell current. These two cases are depicted to illustrate the inventive concepts, and are not limiting.

The control signal XXL remains asserted (keeping transistor Q3 on) only for the duration of $V_L$ sensing. As such, if the cell is a $V_L$ cell (having a Vt greater than $V_L$), the cell discharges by a target amount (e.g., 1V). If the cell is a $V_H$ cell (one having a Vt greater than $V_H$), however, the cell only discharges by an amount less than the target amount (e.g., 0.5V).

At time t4 (determined by the sense time length equation above), the control signal XXL is ramped down, along with the clock signal CLK, which causes the voltage at the sensing node SEN to settle and eventually float. In contrast to scenario 1002 (FIG. 11B) described above, the CLK signal does not fully ramp down. Rather, the CLK signal in scenario 1004 (FIG. 12B) ramps back down to the intermediate (first modulated) level VCLKa. In other words, CLK is ramped down at time t4 by the same delta difference as that used to ramp up CLK at time t2.

If the floating voltage at the sensing node SEN reaches the threshold voltage Vt of the transistor Q1, then the floating voltage causes transistor Q1 to turn on. The timing of the sense time is determined such that a targeted Icell value causes the floating voltage at time t5 to reach the threshold voltage Vt of transistor Q1. In other words, if the cell current Icell equals a targeted value (e.g., 60 nA), then the floating voltage at time t5 causes transistor Q1 to turn on. Conversely, if the cell current Icell equals a value (e.g., 30 nA) other than the targeted value, then the floating voltage at time t5 does not cause transistor Q1 to turn on.

At time t5, a first latching phase begins when a strobe signal STB causes transistor Q2 to turn on. If the cell current Icell was the target value (e.g., 60 nA), then the floating voltage at the sensing node SEN reaches the threshold voltage Vt of the sensing transistor Q1 (at the point labeled L1 in the figure), thereby causing Q1 to turn on. As a result, both Q1 and Q2 are on, providing a path for voltage to charge capacitor C2 (and thereby transfer to the data latch DL). Conversely, if the cell current Icell was not the targeted value, then the floating voltage at the sensing node SEN does not reach (or passes) the threshold voltage Vt of the sensing transistor Q1, thereby preventing Q1 from turning on. As a result, there is no path for voltage to charge capacitor C2 (and thus, nothing is transferred to the data latch DL). Thus, at time t5, the data latch DL stores information regarding whether the cell current Icell met or did not meet the targeted value for a $V_L$ cell (having a Vt greater than $V_L$) during the sense time. In other words, the data latch DL stores a voltage if Icell met the targeted value during the sense time (e.g., if the cell has a threshold voltage Vt of at least $V_L$, putting the cell in zone 904, FIG. 9A), and does not store a voltage if Icell did not meet the targeted value during the sense time (e.g., if the cell does not have a threshold voltage Vt of at least $V_L$, putting the cell in zone 902, FIG. 9A).

In sum, when STB is turned on at time t5, a 60 nA cell (zone 904) will cause SEN voltage to reach Vt of Q1, but a 30 nA cell (zone 906) results in a SEN voltage that is higher than Vt of Q1. As a result, strobing the STB signal across multiple sensing circuits at time t5 only transfers data of the 60 nA cells into respective data latches, effectively completing $V_L$ sensing in scenario 1004 (also referred to as a $V_L$ sensing phase, subphase, operation, or sub-operation of the sensing scenario 1004).

After strobing the STB signal at t5 and transferring information to the data latch DL as described above, $V_L$ sensing is complete, and the sense circuitry 1200 prepares for $V_H$ sensing. However, in contrast to scenario 1002 (FIG. 11B) above, preparing the sense circuitry 1200 for $V_H$ sensing in scenario 1004 (FIG. 12B) does not require additional setting time for bit line settling, word line settling, and so forth. Further, $V_H$ sensing in scenario 1004 does not require all of the operations above to be repeated. Instead, for scenario 1004, only the CLK signal needs to be discharged in preparation for $V_H$ sensing.

At time t6, in preparation for $V_H$ sensing, the clock signal CLK is discharged from the intermediate (first modulation) level VCLKa back to the initial level (e.g., low, Vss, 0V, or a functionally similar level). This operation is sometimes referred to herein as a second discharge operation of the sensing clock, or a second modulation operation of the sensing clock. For cells having a Vt greater than $V_H$ (zone 906), discharging CLK to the intermediate level to the initial level causes the SEN floating voltage to drop (at time t6) to the Vt of the sensing transistor Q1, thereby providing a path to charge capacitor C2 when STB is asserted again at time t7 (referred to herein as a second strobing operation, or a second strobe).

At time t7, a second latching phase begins when the strobe signal STB causes transistor Q2 to turn on. If the cell current Icell was a $V_H$ cell (having a Vt higher than $V_H$ and an Icell target value of, for example, 30 nA), then the floating voltage at the sensing node SEN reaches the threshold voltage Vt of the sensing transistor Q1 (at the point labeled L2 in the figure), thereby causing Q1 to turn on. As a result, both Q1 and Q2 are on, providing a path for voltage to charge capacitor C2 (and thereby transfer to a second data latch DL). Conversely, if the cell current Icell was not that of a $V_H$ cell, then the floating voltage at the sensing node SEN does not reach (or passes) the threshold voltage Vt of the sensing transistor Q1, thereby preventing Q1 from turning on. As a result, there is no path for voltage to charge capacitor C2 (and thus, nothing is transferred to the second data latch DL). Thus, at time t7, the second data latch DL stores information regarding whether the cell current Icell met or did not meet the targeted value for a $V_H$ cell (having a Vt greater than $V_H$) during the sense time. In other words, the second data latch DL stores a voltage if Icell met the targeted value for a $V_H$ cell during the sense time (e.g., if the cell has a threshold voltage Vt of at least $V_H$, putting the cell in zone 906, FIG. 9A), and does not store a voltage if Icell did not meet the targeted value during the sense time (e.g., if the cell does not have a threshold voltage Vt of at least $V_H$, putting the cell in zone 904, FIG. 9A).

In sum, when the STB signal is asserted (strobed) at time t7 for the second strobing operation, a 30 nA cell (zone 906) causes SEN voltage to reach Vt of Q1, but a 60 nA cell (zone 904) results in a SEN voltage that is lower than Vt of Q1. As a result, strobing the STB signal across multiple sensing circuits at time t7 only transfers data of the 30 nA cells into respective data latches, effectively completing $V_H$ sensing in scenario 1004 (also referred to as a $V_H$ sensing phase, subphase, operation, or sub-operation of the sensing scenario 1004).

Comparing the setup time for the two sensing scenarios 1002 and 1004, the second scenario 1004 provides greater performance. In scenario 1002, it may take hundreds of nanoseconds (ns) to reset the sensing circuitry 1100 between $V_L$ and $V_H$ sensing. In scenario 1004, however, it may only take several ns to ramp down the clock signal CLK (between times t6 and t7) between $V_L$ and $V_H$ sensing. Thus, scenario 1004 provides $V_L$ and $V_H$ sensing results with just one sensing operation. The sensing itself happens only once (between times t3 and t4), but the operation transfers two different kinds of data (during $V_L$ latching at time t5 and $V_H$ latching at time t7). By modulating the clock CLK to an intermediate (first modulation level) at the outset of the sensing operation (at time t1), CLK may be ramped down twice in a row (at times t4 and t6), with each ramp-down event resulting in a different sensing result being transferred to a respective data latch (at times t5 and t7).

Figure 13A:
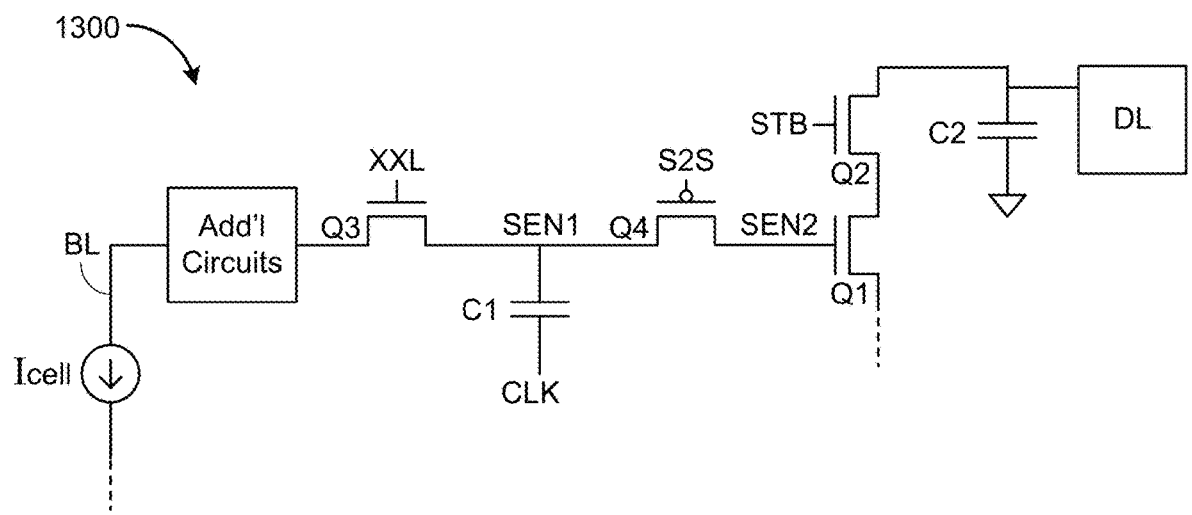
FIG. 13A is a diagram of sensing circuitry in accordance with some implementations.

FIG. 13A is a diagram of sensing circuitry 1300 (e.g., included in sense blocks 370, FIG. 3) in accordance with some implementations. The sense blocks 370 include multiple sensing circuits 1300, and each sensing circuit 1300 is coupled to a bit line (BL) 425 (see FIG. 4F). There may be additional circuitry, including circuitry for pre-charging the bit lines and circuitry for biasing the various signals and modulating the various clock levels. For purposes of brevity and so as not to obscure the inventive concepts, such additional circuitry is not discussed further.

Sensing circuitry 1300 (FIG. 13B) corresponds to sensing circuitry 1200 (FIG. 12B), with corresponding circuit elements sharing similar labels. For purposes of brevity and so as not to obscure the inventive concepts, such corresponding circuitry is not discussed further. In addition to the circuit elements described above, sensing circuitry 1300 includes an additional transistor Q4, which may be configured to amplify the voltage at the sensing node (labeled SEN1 in FIG. 13A). Modulating the gate level of transistor Q4 amplifies the sensing node voltage SEN1. The amplified sensing node voltage (labeled SEN2) enhances the sense level of the sensing transistor Q1 to make the sensing circuitry more noise tolerant. In other words, the gate bias of Q4 may be varied to enhance the sense margin of sensing circuitry C1 and Q1.

Figure 13B:
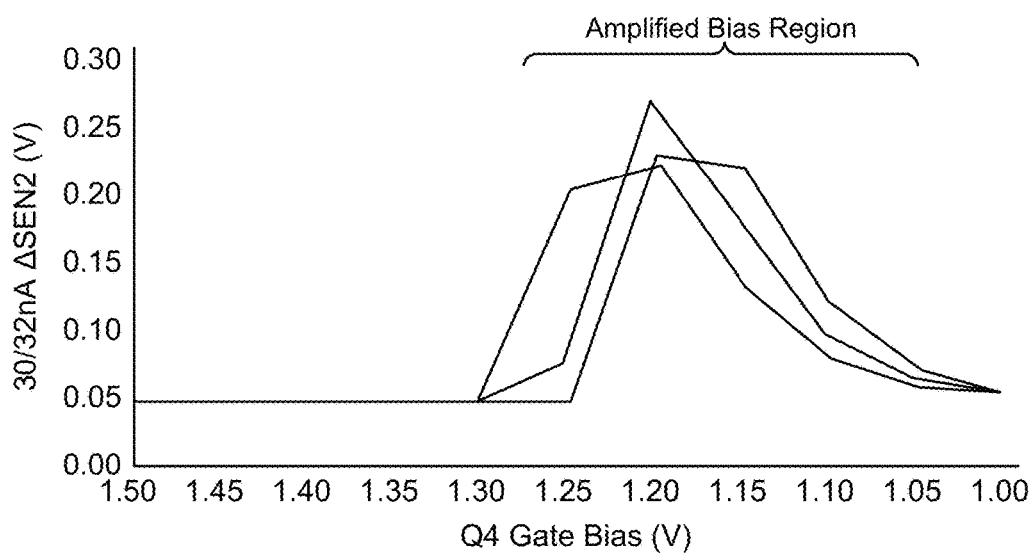
FIG. 13B is a graph depicting an amplified bias region for the amplifying transistor of the sensing circuitry in FIG. 13A in accordance with some implementations.

FIG. 13B is a graph depicting an amplified bias region for the amplifying transistor Q4 of sensing circuitry 1300 in accordance with some implementations. The graph depicts the difference in amplified sensing node SEN2 levels for cells having cell currents Icell of 30 nA and 32 nA, versus gate bias voltages for transistor Q4. As depicted in the graph, biasing Q4 between 1.05V and 1.25V results in amplification of the difference between sensing node voltages SEN2 for cells having different cell currents Icell, thus increasing the sensing margin of the sensing circuitry 1300.

Figure 14A:
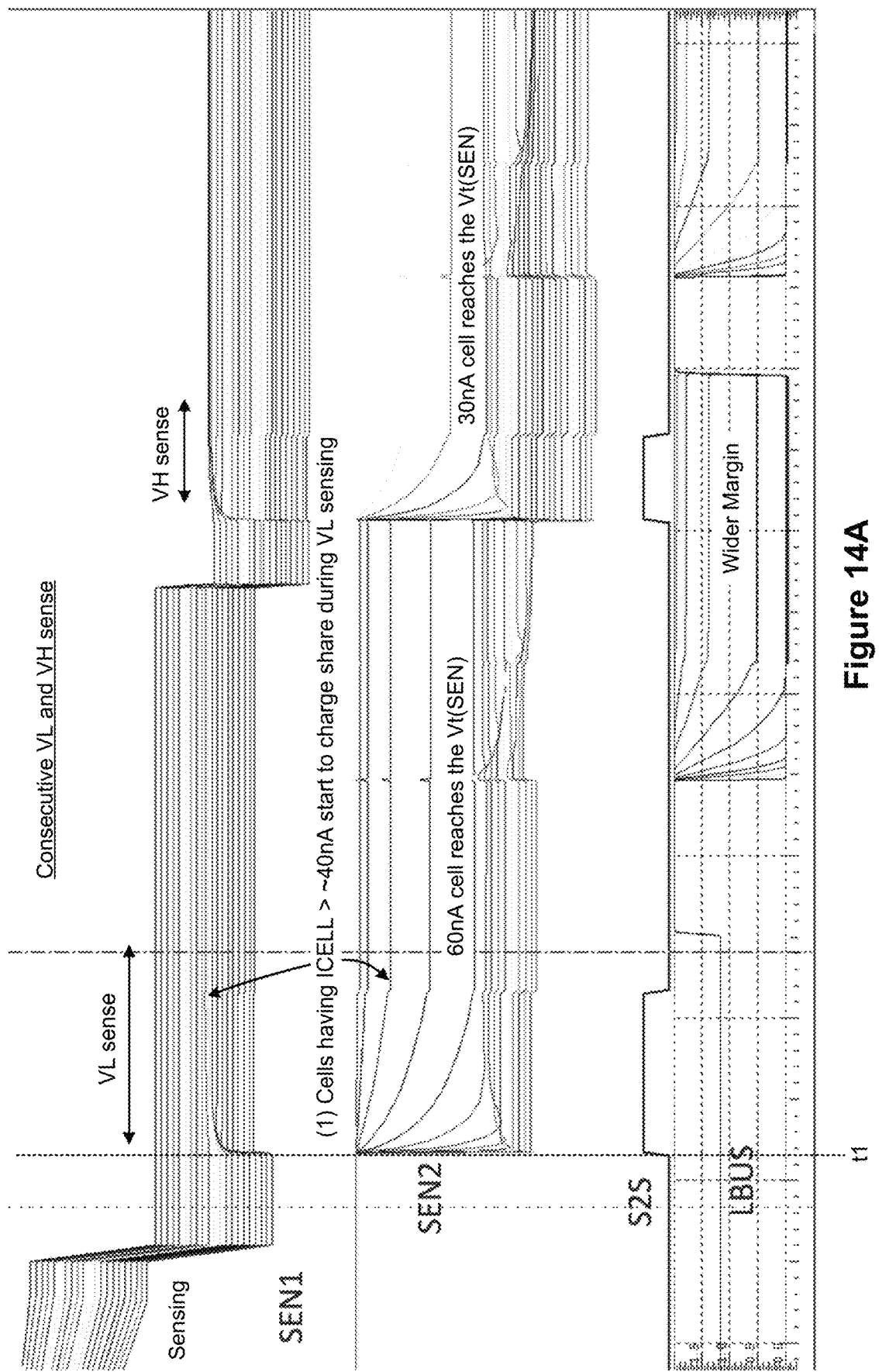
FIG. 14A is a simulation depicting consecutive $V_L$ and $V_H$ sensing operations using sensing circuitry 1300 in accordance with some implementations.

FIG. 14A is a simulation depicting consecutive $V_L$ and $V_H$ sensing operations using sensing circuitry 1300 in accordance with some implementations. The simulation depicts voltages at nodes SEN1 (before amplification by transistor Q4), SEN2 (after amplification by transistor Q4), and S2S (the gate of transistor Q4).

At node SEN1, before amplification, the voltage levels (corresponding to different Icell currents) are very close to each other, making it difficult to differentiate them due to noise in the circuit. Before S2S turns on at time t1, the voltage at node SEN2 remains at an initial precharge level.

When transistor Q4 turns on at time t1 (due to S2S modulating to a high level), the voltage levels at node SEN1 that are lower than the threshold voltage Vt of transistor Q4 cause transistor Q4 to turn on, thereby discharging the voltage levels as shown in the SEN2 portion of the simulation after time t1. The other voltage levels at node SEN1 remain high.

As a result of the aforementioned discharge at time t1, there is a bigger margin between the voltage levels, which makes it easier to differentiate them. Thus, circuitry 1300 can tolerate more noise as a result of the amplification by transistor Q4.

Figure 14B:
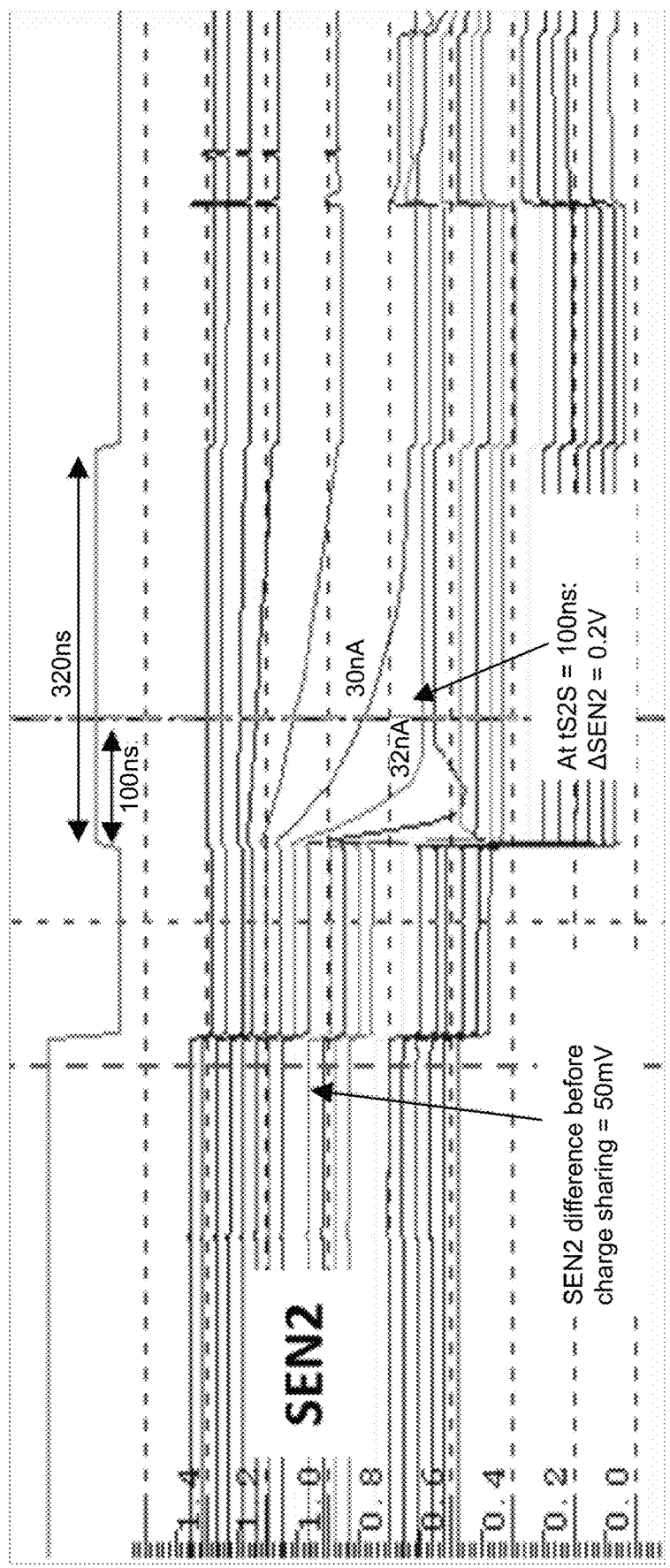
FIG. 14B is a simulation depicting the amplified bias region described above with reference to FIG. 13B in accordance with some implementations.

FIG. 14B is a simulation depicting the amplified bias region described above with reference to FIG. 13B in accordance with some implementations. The simulation depicts the difference in amplified sensing node SEN2 levels for cells having cell currents Icell of 30 nA and 32 nA, versus gate bias voltages for transistor Q4. As depicted in the simulation, biasing Q4 between various levels results in amplification of the difference between sensing node voltages SEN2 for cells having different cell currents Icell, thus increasing the sensing margin of the sensing circuitry 1300.

In sum, by combining multiple sensing phases into a single program verify operation using the concepts described herein, programming performance increases with no degradation to sensing accuracy.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention, different components as opposed to those specifically mentioned may perform at least some of the features described herein, and features of the disclosed embodiments may be combined. As used herein, the terms "about" and "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise.

It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A data storage system, comprising:
   a storage medium including a plurality of memory cells; and
   control circuitry coupled to the storage medium; and
   program circuitry configured to receive a program instruction from the control circuitry and program a subset of the plurality of memory cells in accordance with the program instruction by subjecting the subset of memory cells to at least one program pulse; and
   sensing circuitry configured to verify a programming state of the subset of memory cells subsequent to a first program pulse of the at least one program pulse, wherein the sensing circuitry is configured to verify the programming state by performing a first program verify operation including:
      a setup operation including settling of bit lines associated with the subset of memory cells;
      a sensing operation including subjecting the settled bit lines to a verify voltage signal;
      a first latching operation identifying which memory cells of the subset of memory cells have a Vt that meets a first verify reference voltage, wherein the first verify reference voltage represents a lower limit of a voltage distribution curve of the programming state; and
      a second latching operation identifying which memory cells of the subset of memory cells have a Vt that meets a second verify reference voltage, wherein the second verify reference voltage is lower than the first verify reference voltage;
      wherein the second latching operation follows the first latching operation and precedes setup operations associated with any program verify operation subsequent to the first program verify operation.

2. The data storage system of claim 1, wherein the program circuitry is further configured to:

apply a second program pulse following the first program pulse to memory cells of the subset of memory cells identified as having a Vt that does not meet the second verify reference voltage;
   apply a third program pulse, the third program pulse having a lower magnitude than the second program pulse, following the first program pulse to memory cells of the subset of memory cells identified as having a Vt that meets the second verify reference voltage; and
   inhibit subsequent programming of memory cells of the subset of memory cells identified as having a Vt that meets the first verify reference voltage.

3. The data storage system of claim 1, wherein the sensing operation includes:
   ramping up a clock level of the sensing circuitry from an initial level to a first modulation level; and
   pre-charging a sensing node of the sensing circuitry to pre-charge to a first level while the clock level is at or ramping up to the first modulation level.

4. The data storage system of claim 3, wherein the sensing operation further includes, subsequent to the pre-charging of the sensing node:
   ramping up the clock level of the sensing circuitry to a second modulation level higher than the first modulation level; and
   charging the sensing node to a second level higher than the first level based on a coupling ratio of a capacitor charged in accordance with the clock level.

5. The data storage system of claim 4, wherein:
   the sensing operation further includes, subsequent to the charging of the sensing node:
      discharging the sensing node through a bit line of a memory cell of the subset of memory cells for a first time period, wherein the first time period is based on a target cell current;
      ramping down the clock level to the first modulation level; and
   the first latching operation includes latching a voltage in accordance with the discharged sensing node being higher than a voltage threshold.

6. The data storage system of claim 5, wherein:
   the sensing operation further includes, subsequent to the first strobing operation, ramping down the clock level to the initial level causing the sensing node to further discharge; and
   the second latching operation includes latching a voltage in accordance with the further discharged sensing node being higher than the voltage threshold.

7. The data storage system of claim 1, wherein the sensing circuitry is configured to perform the first and second latching operations without settling any bit lines between the first and second latching operations.

8. A method of programming a plurality of memory cells in a data storage system, the method comprising:
   receiving a program instruction from control circuitry of the data storage system;
   programming a subset of the plurality of memory cells in accordance with the program instruction by subjecting the subset of memory cells to at least one program pulse; and
   verifying a programming state of the subset of memory cells subsequent to a first program pulse of the at least one program pulse by performing a program verify operation including:
      performing a setup operation including settling of bit lines associated with the subset of memory cells;

performing a sensing operation including subjecting the settled bit lines to a verify voltage signal;

performing a first latching operation identifying which memory cells of the subset of memory cells have a Vt that meets a first verify reference voltage, wherein the first verify reference voltage represents a lower limit of a voltage distribution curve of the programming state; and performing a second latching operation identifying which memory cells of the subset of memory cells have a Vt that meets a second verify reference voltage, wherein the second verify reference voltage is lower than the first verify reference voltage;

wherein the second latching operation follows the first latching operation and precedes setup operations associated with any program verify operation subsequent to the first program verify operation.

9. The method of claim 8, wherein the programming further includes:

applying a second program pulse following the first program pulse to memory cells of the subset of memory cells identified as having a Vt that does not meet the second verify reference voltage;

applying a third program pulse, the third program pulse having a lower magnitude than the second program pulse, following the first program pulse to memory cells of the subset of memory cells identified as having a Vt that meets the second verify reference voltage; and inhibiting subsequent programming of memory cells of the subset of memory cells identified as having a Vt that meets the first verify reference voltage.

10. The method of claim 8, wherein the sensing operation includes:

ramping up a clock level of the sensing circuitry from an initial level to a first modulation level; and pre-charging a sensing node of the sensing circuitry to pre-charge to a first level while the clock level is at or ramping up to the first modulation level.

11. The method of claim 10, wherein the sensing operation further includes, subsequent to the pre-charging of the sensing node:

ramping up the clock level of the sensing circuitry to a second modulation level higher than the first modulation level; and charging the sensing node to a second level higher than the first level based on a coupling ratio of a capacitor charged in accordance with the clock level.

12. The method of claim 11, wherein:

the sensing operation further includes, subsequent to the charging of the sensing node:

discharging the sensing node through a bit line of a memory cell of the subset of memory cells for a first time period, wherein the first time period is based on a target cell current;

ramping down the clock level to the first modulation level; and the first latching operation includes latching a voltage in accordance with the discharged sensing node being higher than a voltage threshold.

13. The method of claim 12, wherein:

the sensing operation further includes, subsequent to the first strobing operation, ramping down the clock level to the initial level causing the sensing node to further discharge; and the second latching operation includes latching a voltage in accordance with the further discharged sensing node being higher than the voltage threshold.

14. The method of claim 8, wherein program verify operation includes performing the first and second latching operations without settling any bit lines between the first and second latching operations.

15. A data storage system, comprising:

a storage medium including a plurality of memory cells; and control circuitry coupled to the storage medium; and program circuitry configured to receive a program instruction from the control circuitry and program a subset of the plurality of memory cells in accordance with the program instruction by subjecting the subset of memory cells to at least one program pulse; and sensing circuitry configured to verify a programming state of the subset of memory cells subsequent to a first program pulse of the at least one program pulse, wherein the sensing circuitry is configured to verify the programming state by performing a first program verify operation including:

means for performing a setup operation including settling of bit lines associated with the subset of memory cells;

means for performing a sensing operation including subjecting the settled bit lines to a verify voltage signal;

means for performing a first latching operation identifying which memory cells of the subset of memory cells have a Vt that meets a first verify reference voltage, wherein the first verify reference voltage represents a lower limit of a voltage distribution curve of the programming state; and means for performing a second latching operation identifying which memory cells of the subset of memory cells have a Vt that meets a second verify reference voltage, wherein the second verify reference voltage is lower than the first verify reference voltage;

wherein the second latching operation follows the first latching operation and precedes setup operations associated with any program verify operation subsequent to the first program verify operation.

16. The data storage system of claim 15, wherein the program circuitry further includes:

means for applying a second program pulse following the first program pulse to memory cells of the subset of memory cells identified as having a Vt that does not meet the second verify reference voltage;

means for applying a third program pulse, the third program pulse having a lower magnitude than the second program pulse, following the first program pulse to memory cells of the subset of memory cells identified as having a Vt that meets the second verify reference voltage; and means for inhibiting subsequent programming of memory cells of the subset of memory cells identified as having a Vt that meets the first verify reference voltage.

17. The data storage system of claim 15, wherein the means for performing the sensing operation include:

means for ramping up a clock level of the sensing circuitry from an initial level to a first modulation level; and means for pre-charging a sensing node of the sensing circuitry to pre-charge to a first level while the clock level is at or ramping up to the first modulation level.

18. The data storage system of claim 17, wherein the means for performing the sensing operation further include, subsequent to the pre-charging of the sensing node:

means for ramping up the clock level of the sensing circuitry to a second modulation level higher than the first modulation level; and means for charging the sensing node to a second level higher than the first level based on a coupling ratio of a capacitor charged in accordance with the clock level.

19. The data storage system of claim 18, wherein:

the means for performing the sensing operation further include, subsequent to the charging of the sensing node:
- discharging the sensing node through a bit line of a memory cell of the subset of memory cells for a first time period, wherein the first time period is based on a target cell current;
- ramping down the clock level to the first modulation level; and the means for performing the first latching operation include latching a voltage in accordance with the discharged sensing node being higher than a voltage threshold.

20. The data storage system of claim 19, wherein:

the means for performing the sensing operation further include, subsequent to the first strobing operation, ramping down the clock level to the initial level causing the sensing node to further discharge; and the means for performing the second latching operation include latching a voltage in accordance with the further discharged sensing node being higher than the voltage threshold.

\* \* \* \* \*